(12) United States Patent
Kawabata et al.

(10) Patent No.: US 9,052,099 B2
(45) Date of Patent: *Jun. 9, 2015

(54) LED LAMP

(71) Applicant: ROHM CO., LTD., Kyoto-shi, Kyoto (JP)

(72) Inventors: Yusaku Kawabata, Kyoto (JP); Hiroshi Fukumoto, Kyoto (JP); Takao Iemoto, Kyoto (JP); Toshio Watanabe, Kyoto (JP); Hideharu Osawa, Kyoto (JP); Hiroyuki Fukui, Kyoto (JP); Hirotaka Shimizu, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/055,460

(22) Filed: Oct. 16, 2013

(65) Prior Publication Data

US 2014/0043801 A1 Feb. 13, 2014

Related U.S. Application Data

(63) Continuation of application No. 13/129,746, filed as application No. PCT/JP2009/069602 on Nov. 19, 2009, now Pat. No. 8,591,057.

(30) Foreign Application Priority Data

| Nov. 19, 2008 | (JP) | 2008-295112 |
| Nov. 19, 2008 | (JP) | 2008-295113 |
| Nov. 19, 2008 | (JP) | 2008-295114 |
| Nov. 25, 2008 | (JP) | 2008-299254 |
| Nov. 25, 2008 | (JP) | 2008-299255 |
| Dec. 1, 2008 | (JP) | 2008-306194 |
| Dec. 1, 2008 | (JP) | 2008-306196 |
| Dec. 15, 2008 | (JP) | 2008-318079 |

(51) Int. Cl.
*F21S 4/00* (2006.01)
*G02B 6/43* (2006.01)
(Continued)

(52) U.S. Cl.
CPC ............. *F21V 21/005* (2013.01); *G02B 6/0003* (2013.01); *F21K 9/00* (2013.01);
(Continued)

(58) Field of Classification Search
CPC ............. F21K 9/17; F21K 9/175; F21K 9/52; F21K 9/00; F21V 21/005; F21V 29/2293; F21V 29/22; F21V 29/004; F21V 29/225; F21V 29/2256; F21V 29/2262; F21V 23/026; F21V 2200/30; F21Y 2101/02; F21Y 2103/003; G02B 6/0003
USPC ....................... 362/84, 217.02, 223, 224, 230, 362/235–237, 249.02–249.06, 218, 294, 362/311.02, 311.1, 311.14, 551, 555, 580
See application file for complete search history.

(56) References Cited

U.S. PATENT DOCUMENTS

| 6,158,882 A | 12/2000 | Bischoff, Jr. |
| 6,561,690 B2 | 5/2003 | Balestriero et al. |

(Continued)

FOREIGN PATENT DOCUMENTS

| CN | 101173758 | 5/2008 |
| CN | 201096278 Y | 8/2008 |

(Continued)

OTHER PUBLICATIONS

English machine translation of Fuminari (JP 2005-208412) Apr. 8, 2005.

*Primary Examiner* — Alan Cariaso
(74) *Attorney, Agent, or Firm* — Hamre, Schumann, Mueller & Larson, P.C.

(57) ABSTRACT

An LED lamp A1 includes a plurality of LED modules 1 and a substrate 2 on which the LED modules 1 are mounted in a row. A light guide 3 covering the LED modules 1 is provided on the substrate 2. The light guide 3 is held in close contact with each of the LED modules. With this arrangement, a proper amount of light is obtained with the use of a smaller number of LED modules 1 or with less power consumption.

11 Claims, 30 Drawing Sheets

(51) Int. Cl.
| | | |
|---|---|---|
| *F21V 29/00* | (2006.01) | |
| *F21V 21/005* | (2006.01) | |
| *F21K 99/00* | (2010.01) | |
| F21V 8/00 | (2006.01) | |
| F21Y 101/02 | (2006.01) | |
| F21Y 103/00 | (2006.01) | |
| F21V 23/02 | (2006.01) | |

(52) U.S. Cl.
CPC .. *F21K 9/17* (2013.01); *F21K 9/52* (2013.01); *F21Y 2101/02* (2013.01); *F21Y 2103/003* (2013.01); *F21V 29/004* (2013.01); *F21V 23/026* (2013.01); *F21V 29/70* (2015.01); *F21V 29/75* (2015.01); *F21V 29/763* (2015.01); *F21V 29/767* (2015.01); *F21V 29/83* (2015.01)

(56) References Cited

U.S. PATENT DOCUMENTS

| | | |
|---|---|---|
| 6,592,238 B2 | 7/2003 | Cleaver et al. |
| 6,853,151 B2 * | 2/2005 | Leong et al. ............. 315/185 R |
| 6,860,628 B2 * | 3/2005 | Robertson et al. ............ 362/555 |
| 7,011,421 B2 | 3/2006 | Hulse et al. |
| 7,159,997 B2 | 1/2007 | Reo et al. |
| 7,234,844 B2 | 6/2007 | Bolta et al. |
| 7,871,181 B2 | 1/2011 | Fan |
| 8,591,057 B2 * | 11/2013 | Kawabata et al. ....... 362/217.02 |

FOREIGN PATENT DOCUMENTS

| | | |
|---|---|---|
| CN | 201133613 | 10/2008 |
| CN | 201141553 | 10/2008 |
| JP | 6-54103 | 7/1994 |
| JP | 11-97747 | 4/1999 |
| JP | 11-135274 | 5/1999 |
| JP | 2004-30929 | 1/2004 |
| JP | 2004-192833 | 7/2004 |
| JP | 2004-526185 | 8/2004 |
| JP | 2005-19260 | 1/2005 |
| JP | 2005-208412 | 8/2005 |
| JP | 2005-529457 | 9/2005 |
| JP | 3142719 | 6/2008 |
| JP | 2008-192353 | 8/2008 |
| JP | 2008-541388 | 11/2008 |
| WO | WO 03/104712 | 12/2003 |

* cited by examiner

LED LAMP

This application is a Continuation of U.S. Ser. No. 13/129,746, filed May 17, 2011, which is a National Stage Application of PCT/JP2009/069602, filed Nov. 19, 2009, which applications are incorporated herein by reference.

TECHNICAL FIELD

The present invention relates to an LED lamp that uses a light emitting diode (hereinafter referred to as "LED") as the light source and is attachable to a general-use fluorescent lighting fixture as a substitute for a fluorescent lamp.

BACKGROUND ART

FIG. 35 shows a conventional LED lamp (see Patent Document 1, for example). The LED lamp X illustrated in the figure includes a substrate 91 in the form of an elongated rectangle, a plurality of LEDs 92 mounted on the substrate 91, a tube 93 accommodating the substrate 91, and terminals 94. The substrate 91 is formed with a wiring pattern (not shown) connected to the LEDs 92 and the terminals 94. The LED lamp X is structured such that the LEDs 92 can be turned on when the terminals 94 are fitted into inlet ports of sockets of a general-use fluorescent lighting fixture.

The general-use fluorescent lighting fixture herein refers to lighting fixtures widely used for interior lighting as the main application, and more specifically, lighting fixtures which use, for example in Japan, a commercial 100 V or 200 V power supply and to which a JIS C7617 straight-tube fluorescent lamp or a JIS C7618 circular fluorescent lamp can be attached.

In the LED lamp X, on the substrate 91 is mounted a circuit 95 for converting alternating current supplied from a commercial power supply into direct current and supplying the current to the LEDs as a constant current. The circuit includes a plurality of power supply parts. Thus, it is preferable that the circuit 95 having this structure is arranged adjacent to the terminals 94, which are the power supply regions, i.e., adjacent to ends of the LED lamp X.

In the above-described conventional LED lamp X, however, a space exists between the tube 93, which serves as a cover, and the LEDs 92. Thus, because of the difference in index of refraction between these parts, part of the light is reflected at the inner surface of the tube 93. Thus, to achieve a sufficient amount of light emission from the lamp, a large number of LEDs 92 needs to be used or a large current needs to be supplied to the LEDs.

The circuit 95 is mounted on the reverse surface (the surface opposite to the surface on which the LEDs 92 are mounted) of the substrate 91. Considering the influences of the heat generated at the LEDs 92, the power supply parts constituting the circuit 95 should not be placed at positions that overlap the LEDs 92 as shown in FIG. 35. Instead, the power supply parts are preferably deviated in the longitudinal direction of the substrate 91 to be placed at the ends of the substrate spaced in the longitudinal direction so as not to overlap the LEDs 92. However, when the power supply parts are placed so as not to overlap the LEDs 92, LEDs 92 cannot be placed adjacent to the ends of the substrate 91. This increases the non-light-emitting area of the LED lamp X, which is not desirable.

To make the LED lamp X having the above-described structure, the substrate 91 is first inserted into the tube 93. Then, the terminals 94 need to be attached to the ends of the tube 93, while keeping the positional relationship between the tube 93 and the substrate 91 unchanged. In this way, the process for manufacturing the conventional LED lamp X is troublesome.

Further, in the conventional LED lamp X, directivity of the light from the LEDs 92 is high. Thus, mounting of such LEDs 92 on a single substrate 91 cannot achieve uniform illumination over an entire area from a ceiling to a bottom, for example.

Further, when the conventional LED lamp X is used as a substitute for a straight-tube fluorescent lamp, e.g. for a FL40W type having a long tube length (tube length 1198 mm), the LEDs 92 need to provide a light emission area of about 1100 mm that substantially corresponds to the tube length. To achieve uniform illumination by the LED lamp X, the LEDs 92 need to be arranged at equal intervals. When the interval between the LEDs 92 is large, relatively dark portions are provided between adjacent LEDs, resulting in non-uniform brightness. To avoid such non-uniform brightness, it is necessary to increase the number of the LEDs 92 and reduce the interval between the LEDs 92.

However, when the number of the LEDs 92 is increased, the power consumption of the LED lamp X increases. For the power consumption of the LEDs 92 to be suppressed to a level equal to or lower than that of a fluorescent lamp, the interval between the LEDs 92 cannot be reduced to a level that eliminates the non-uniformity of brightness between adjacent LEDs 92.

Moreover, in the LED lamp X, heat is generated during the lighting of the LEDs 92. Thus, the temperature of the substrate 91 and the LEDs 92 undesirably increases to result in the breakage of the wiring pattern on the obverse surface of the substrate 91 and the LEDs 92.

The circuit 95 is mounted on the reverse surface (the surface opposite to the surface on which the LEDs 92 are mounted) of the substrate 91. Considering the influences of the heat generated at the LEDs 92, the power supply parts constituting the circuit 95 should not be placed at positions that overlap the LEDs 92 as shown in the figure. Instead, the power supply parts are preferably deviated in the longitudinal direction of the substrate 91 to be placed at the ends of the substrate spaced in the longitudinal direction so as not to overlap the LEDs 92. That is, it is preferable that the power supply parts are arranged separately in a region (power supply region) different from the region (light source region) where the LEDs 92 are arranged.

However, when the power supply parts are arranged in the power supply region (ends of the substrate 91) separate from the light source region where the LEDs 92 are placed, LEDs 92 cannot be arranged adjacent to the ends of the substrate 91. As a result, the regions adjacent to the ends of the substrate 91 become a non-light-emitting area. This leads to a degraded illumination quality of the lamp X, which is not desirable.

FIG. 36 is a block diagram showing an LED lighting apparatus provided by attaching an LED lamp to a conventional general-use fluorescent lighting fixture. The general-use fluorescent lighting fixture herein refers to lighting fixtures widely used for interior lighting as the main application, and more specifically, lighting fixtures which use, for example in Japan, a commercial 100 V or 200 V power supply and to which a JIS C7617 straight-tube fluorescent lamp or a JIS C7618 circular fluorescent lamp can be attached. The LED lighting apparatus B' includes a general-use fluorescent lighting fixture C and an LED lamp A'.

The general-use fluorescent lighting fixture C is originally designed to input alternating current from a commercial 100 V power supply D to a fluorescent lamp mounted to the lighting fixture. The general-use fluorescent lighting fixture C includes a ballast C1. The ballast C1 is designed to generate a high voltage in a fluorescent lamp to start a discharge and stabilize the current inputted into the fluorescent lamp after the start of the discharge. General-use fluorescent lighting fixtures C are classified into a starter type, a rapid start type, an inverter type and so on, depending on the mode of the lighting of fluorescent lamps. In the state in which the LED lamp A' is attached to the lighting fixture, the voltage, current and frequency outputted from the ballast C1 vary depending on the lighting mode even when the rated voltage is the same. Moreover, even when the lighting mode is the same, the characteristics of the ballast C1 slightly vary depending on the kinds of the general-use fluorescent lighting fixture C.

The LED lamp A' emits light when alternating current from a commercial 100 V power supply is inputted into the lamp via the ballast C1 of the general-use fluorescent lighting fixture C. The LED lamp A' includes a rectifying circuit 100, a protective part 200 and an LED lighting circuit 300. The rectifying circuit 100 converts an alternating current inputted from the ballast C1 into a direct current and outputs the direct current to the LED lighting circuit 300. The LED lighting circuit 300 turn on the white LEDs 310a incorporated in it by using the direct current inputted from the rectifying circuit 100. The specification and number of the white LEDs 310a connected in series to form an LED row 310 and the resistance of the resistor 320 in the LED lighting circuit 300 are determined based on the rated voltage of the general-use fluorescent lighting fixture C to which the lamp is attached.

Since the voltage, current and frequency to be inputted vary depending on the ballast C1, the resistor 320 is provided in the LED lighting circuit 300 to prevent excessive current from flowing to the white LEDs 310a. Further, it is also proposed to connect a constant current circuit such as a constant current diode to the input side of the white LEDs 310a to keep the current flowing to the white LEDs 310a constant.

However, the resistor 320 consumes electric power by conversion into heat and hence deteriorates the use efficiency of electric power. Further, to connect a constant current circuit, a region for arranging such a circuit needs to be secured in the LED lighting circuit 300. Since white LEDs 310a cannot be placed in this region, the non-light-emitting area, which is dark, increases. Moreover, the use of a constant current circuit increases the manufacturing cost.

Patent Document 1: JP-U-6-54103

DISCLOSURE OF THE INVENTION

Problems to be Solved by the Invention

The present invention is proposed under the circumstances described above. It is therefore an object of the present invention to provide an LED lamp that can provide a proper amount of light emission with the use of a smaller number of LEDs or with less power consumption.

Means for Solving the Problems

To solve the above-described problems, the present invention takes the following technical measures.

An LED lamp provided according to the present invention includes a plurality of LED light sources, and a substrate on which the LED light sources are mounted in a row. A light guide covering the LED light sources is provided on the substrate. The light guide is held in close contact with each of the LED light sources.

In a preferred embodiment of the present invention, the light guide is semicircular in cross section.

In a preferred embodiment of the present invention, the LED lamp further includes a light-transmitting cover held in close contact with the entirety of an outer surface of the light guide.

In a preferred embodiment of the present invention, the LED lamp further includes a heat dissipation member attached to a surface of the substrate that is opposite to the mount surface on which the LED light sources are mounted.

In a preferred embodiment of the present invention, the light guide contains a fluorescent material that emits light of a wavelength different from a wavelength of light from the LED light sources when excited by the light from the LED light sources.

In a preferred embodiment of the present invention, the LED light source comprises an LED module. The LED module includes an LED bare chip and a resin package that seals the LED bare chip.

In a preferred embodiment of the present invention, the LED light source comprises an LED bare chip mounted on the substrate.

In a preferred embodiment of the present invention, the LED lamp includes a first substrate on which a plurality of LEDs are mounted, a second substrate on which a plurality of power supply parts are mounted, and a tubular case having a circular cross section and accommodating the first substrate and the second substrate. The power supply parts are mounted on opposite surfaces of the second substrate.

In a preferred embodiment of the present invention, the first substrate and the second substrate are spaced from each other in the thickness direction of the substrate. The first substrate is located at a position deviated in the radial direction from the center axis of the case, and the second substrate is closer to the center axis than the first substrate is.

In a preferred embodiment of the present invention, the first substrate is located at a position deviated relative to the center axis of the case in a direction opposite to the mount surface of the LEDs.

In a preferred embodiment of the present invention, the LED lamp further includes a heat dissipation member extending parallel to the center axis of the case, and a pair of bases attached to ends of the heat dissipation member. The first substrate is laid on the heat dissipation member, whereas the second substrate is spaced from the heat dissipation member.

In a preferred embodiment of the present invention, the second substrate is supported by the heat dissipation member.

In a preferred embodiment of the present invention, the power supply parts include an AC/DC converter for converting alternating current into direct current.

In a preferred embodiment of the present invention, the case is in the form of a straight tube. The case is integrally formed with projections that project inward to make a pair within a plane parallel to the center axis of the case. Movement of the first substrate relative to the case in the radial direction is restricted by the projections.

An LED lighting apparatus provided according to another aspect of the present invention includes a ballast for stabilizing alternating current inputted from an AC power supply, a rectifying circuit for performing full-wave rectification with respect to the alternating current inputted from the ballast, and a lighting circuit directly connected to the rectifying circuit. The lighting circuit consists of a plurality of LEDs that emit light when direct current is inputted from the rectifying circuit, and a connection line that connects a substrate on which the LEDs are mounted and each of the LEDs.

In a preferred embodiment of the present invention, the lighting circuit includes a plurality of LED rows each including a plurality of LEDs connected in series, and the LED rows are connected in parallel with each other.

In a preferred embodiment of the present invention, a protective part is connected between the rectifying circuit and the lighting circuit.

In a preferred embodiment of the present invention, the protective part is a Zener diode or a fuse.

An LED lamp provided according to still another aspect of the present invention includes a plurality of LED substrates on each of which a plurality of LED modules are mounted, and a cylindrical light-transmitting tube accommodating the LED substrates. The plurality of LED substrates are accommodated in such a manner as to define a cross section in the form of a sector together with part of the light-transmitting tube when the interior of the light-transmitting tube is viewed in the axial direction.

In a preferred embodiment of the present invention, provided that the internal space of the light-transmitting tube is divided along a line of a diameter into two parts, the LED substrates are positioned within one of two semicircular regions when the interior of the light-transmitting tube is seen in the axial direction.

In a preferred embodiment of the present invention, the LED substrates are arranged such that the mount surfaces of the LED modules are oriented toward the other one of the semicircular regions.

In a preferred embodiment of the present invention, a heat dissipation member is provided on the reverse surfaces of the LED substrates opposite to the mount surfaces.

In a preferred embodiment of the present invention, the heat dissipation member is formed with a through-hole extending in the axial direction of the light-transmitting tube.

In a preferred embodiment of the present invention, an LED lamp includes a plurality of LEDs arranged at predetermined intervals. The plurality of LEDs include a plurality of first LEDs, and a plurality of second LEDs having lower power consumption than the first LEDs. Each of the second LEDs is arranged between adjacent first LEDs.

In a preferred embodiment of the present invention, at least two first LEDs are arranged between adjacent second LEDs. The interval between the second LED and the first LED that are adjacent to each other is smaller than the interval between adjacent first LEDs.

In a preferred embodiment of the present invention, each of the second LEDs is placed at the intermediate position between adjacent first LEDs.

In a preferred embodiment of the present invention, the first LEDs are so arranged that a plurality first LED series connection portions, each consisting of a predetermined number of first LEDs connected in series, are connected in parallel with each other. The second LEDs are connected in series to form a second LED series connection portion. The first LED series connection portions and the second LED series connection portion are connected in parallel with each other.

In a preferred embodiment of the present invention, the number of the second LEDs constituting the second LED series connection portion is larger than the number of the first LEDs constituting the first LED series connection portion.

According to still another aspect of the present invention, there is provided an LED lamp including an LED element. The LED lamp includes a heat dissipation member for supporting the LED element, an insulating layer laid on the surface of the heat dissipation member, and a metal wiring layer laid on the surface of the insulating layer and electrically connected to the LED element.

In a preferred embodiment of the present invention, the insulating layer is made of $SiO_2$.

In a preferred embodiment of the present invention, the LED lamp includes an LED module including the LED element, a lead having an obverse surface on which the LED element is mounted, and a resin package covering the LED element and the lead. The reverse surface of the lead is bonded to the metal wiring layer.

According to still another aspect of the present invention, there is provided an LED lamp including an LED element. The LED lamp includes a heat dissipation member for supporting the LED element, and a substrate provided in contact with the heat dissipation member. The substrate includes at least an electrically insulating base film layer, and a metal wiring layer formed on the base film layer. The LED element is electrically connected to the metal wiring layer.

In a preferred embodiment of the present invention, the base film layer is made of polyimide.

In a preferred embodiment of the present invention, the LED lamp includes an LED module including the LED element, a lead having an obverse surface on which the LED element is mounted, and a resin package covering the LED element and the lead. The reverse surface of the lead is bonded to the metal wiring layer.

In a preferred embodiment of the present invention, the substrate is a flexible wiring substrate.

According to still another aspect of the present invention, there is provided a method for making an LED lamp including a plurality of LED elements, a heat dissipation member for supporting the LED elements, and a flexible wiring substrate provided in contact with the heat dissipation member and including at least an electrically insulating base film layer and a metal wiring layer formed on the base film layer. The method includes the steps of forming the heat dissipation member having a predetermined shape, mounting the LED elements on an elongated base material that is in advance formed with a metal wiring layer as a wiring pattern and that is to become the flexible wiring substrate, cutting the base material on which the LED elements are mounted into the length of the heat dissipation member, and bonding the flexible wiring substrate obtained by the cutting to the heat dissipation member.

An LED lamp provided according to still another aspect of the present invention includes a plurality of LEDs arranged in a light source region, a plurality of power supply parts arranged in a power supply region, a tubular case accommodating the LEDs and the power supply parts. The lamp further includes auxiliary light source means for emitting light to the outside from the area of the case that corresponds to the power supply region.

In a preferred embodiment of the present invention, the auxiliary light source means includes an additional LED arranged in the power supply region. Preferably, in this case, the auxiliary light source means includes a light guide. The light guide includes a light introducing portion for introducing the light from the additional LED to the inside, and a light emitting portion that is in the form of a part of a cylinder extending along the inner surface of the case and that allows the light from the light introducing portion to travel and to be emitted to the outside through a light emitting surface provided on the outer side.

In a preferred embodiment of the present invention, the auxiliary light source means includes a light guide. The light guide includes alight introducing portion for introducing the light from at least one of the LEDs to the inside, and a light emitting portion that is in the form of a part of a cylinder extending along the inner surface of the case and that allows the light from the light introducing portion to travel and to be emitted to the outside through a light emitting surface provided on the outer side.

In a preferred embodiment of the present invention, the inner side of the light emitting portion comprises a light reflection surface for reflecting light introduced from the light introducing portion toward the light emitting surface.

In a preferred embodiment of the present invention, the LEDs are mounted on one of the surfaces of the first substrate, whereas the power supply parts are mounted on opposite surfaces of the second substrate.

In a preferred embodiment of the present invention, the case is in the form of a straight tube having a circular cross section. The first substrate and the second substrate are spaced from each other in the thickness direction of the substrate.

The first substrate is located at a position deviated in the radial direction from the center axis of the case, and the second substrate is closer to the center axis than the first substrate is.

In a preferred embodiment of the present invention, the case is integrally formed with projections that project inward to make a pair within a plane parallel to the center axis of the case. Movement of the first substrate relative to the case in the radial direction is restricted by the projections.

In a preferred embodiment of the present invention, the case is integrally formed with projections that project inward to make a pair within a plane parallel to the center axis of the case. Movement of the light guide relative to the case is restricted by the projections. Preferably, in this case, movement of the substrate on which the LEDs are mounted and the light guide relative to the case is restricted by the projections.

Other features and advantages of the present invention will become more apparent from the detailed description given below with reference to the accompanying drawings.

BEST MODE FOR CARRYING OUT THE INVENTION

Preferred embodiments of the present invention are described below with reference to the drawings.

Figure 1:
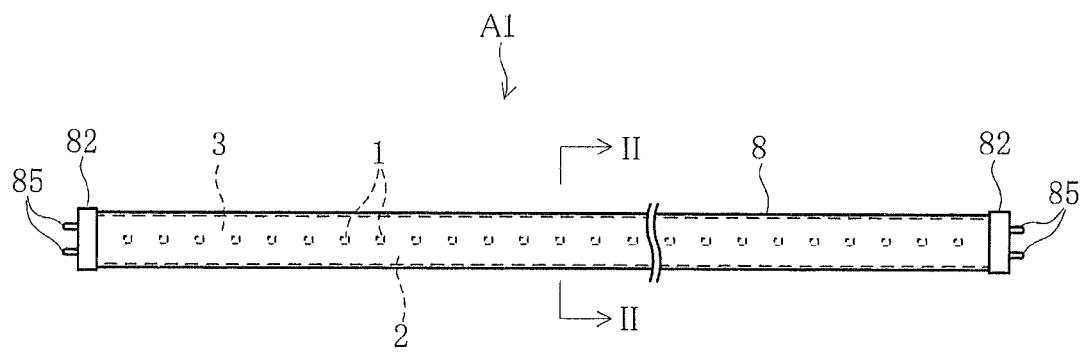
FIG. 1 is a plan view showing an LED lamp according to a first embodiment of the present invention.
Figure 2:
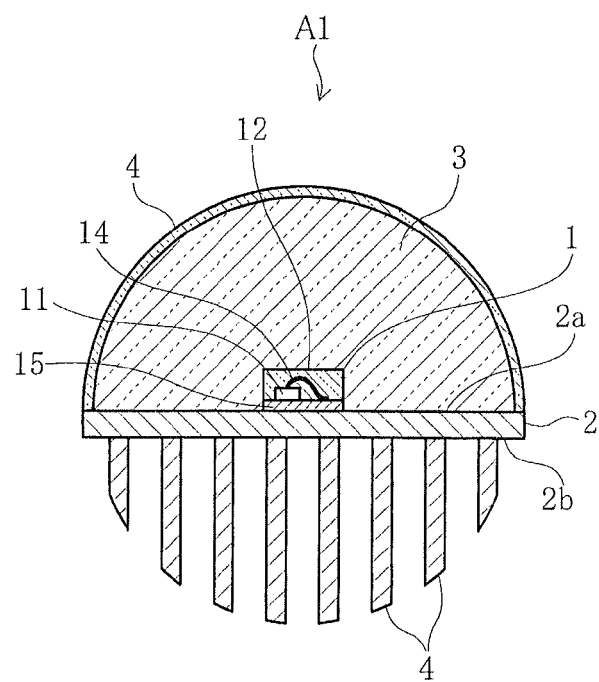
FIG. 2 is a sectional view taken along lines II-II in FIG. 1.

FIGS. 1 and 2 show an LED lamp according to a first embodiment of the present invention. The LED lamp A1 of this embodiment includes a plurality of LED modules 1 serving as a light source, a substrate 2, a light guide 3, a light-transmitting cover 8, heat dissipation members 4 and bases 82, and has an elongated cylindrical shape as a whole. For instance, the LED lamp A1 is used as attached to a general-use fluorescent lighting fixture, as a substitute for e.g. a straight-tube fluorescent lamp.

The LED modules 1 are mounted on the substrate 2 at predetermined intervals in a row. As shown in FIG. 2, each of the LED modules 1 is made up of an LED bare chip 11, a resin package 12, a bonding wire 14 and a base member 15. For instance, the LED bare chip 11 is made of a GaN-based semiconductor and emits blue light. The resin package 12 is made of e.g. silicone resin that transmits light, and covers the LED bare chip 11. The resin package 12 contains a fluorescent material that emits yellow light when excited by blue light, for example. The bonding wire 14 electrically connects the LED bare chip 11 and the base member 15. The base member 15 is bonded to the substrate 2 as electrically connected to a wiring pattern (not shown) of the substrate 2.

The substrate 2 is made of e.g. Al and has an elongated rectangular shape. The mount surface 2a of the substrate 2, on which the LED modules 1 are mounted, is covered by the light guide 3. On the reverse surface 2b of the substrate 2, which is opposite to the mount surface 2a, are provided the heat dissipation members 4.

The light guide 3 is provided for efficiently diffusing light from the LED modules 1 to the outside. The light guide covers the LED modules 1 in close contact with the LED modules. The light guide 3 has a semicircular cross section and is made of e.g. the same material as the basic material of the resin package 12 of the LED module 1. Thus, e.g. blue light emitted from the LED bare chip 11 of the LED module 1 passes through the resin package 12 of the LED module 1 and the light guide 3 for emission to the outside.

The light-transmitting cover 8 is provided for diffusing the light emitted from the LED module 1 and guided through the light guide 3. The light-transmitting cover covers the light guide 3 in close contact with the light guide. The light-transmitting cover 8 is in the form of the arc of a semicircle in cross section and made of e.g. glass.

The light guide 3 is arranged so as not to define a gap between itself and the LED modules 1 or the light-transmitting cover 8. This arrangement suppresses reflection of light at the boundary between the light guide 3 and the LED modules 1 or the light-transmitting cover 8. Thus, the light from the LED modules 1 is efficiently guided to the outside.

The heat dissipation members 4 are made of e.g. Al similarly to the substrate 2 and extend vertically from the reverse surface 2b of the substrate 2. The heat dissipation members 4 are arranged side by side at predetermined intervals in the width direction of the substrate 2 and exposed to the outside air. Thus, the heat dissipation members 4 efficiently dissipate the heat generated due to the lighting of the LED modules 1 to the outside air.

The bases 82 are the portions to be fitted into the inlet ports of a general-use fluorescent lighting fixture and have terminals 85 for electrical conduction. The bases 82 are attached to the ends of the substrate 2 spaced in the longitudinal direction. Each of the terminals 85 is connected to the wiring pattern (not shown) on the substrate 2. By fitting each terminal 85 into an inlet port of the fluorescent lighting fixture, electric power is supplied to the LED modules 1, whereby the LED bare chips 11 are turned on.

The advantages of the LED lamp A1 are described below. Part of the blue light emitted from the LED bare chips 11 becomes yellow light because of the fluorescent material contained in the resin package 12. The yellow light and the remaining blue light are mixed to produce white light. The white light is emitted from the resin package 12 to the light guide 3 and diffused within the light guide 3. The white light is then emitted from the outer surface of the light guide 3 to the outside through the light-transmitting cover 8. To emit white light, the fluorescent material as described above may be contained in the light guide 3, instead of in the resin package 12. Alternatively, use may be made of an LED module 1 which includes red, green and blue LED bare chips 11 collectively sealed in the resin package 12.

Since the resin package 12 and the light guide 3, which are made of the same material, are arranged in close contact with each other, light passes from the resin package 12 to the light guide 3 with almost no refraction. Further, the difference in index of refraction between the light guide 3 made of silicone resin and the light-transmitting cover 8 made of glass is relatively small. Thus, light passes from the light guide 3 to the light-transmitting cover 8 with almost no refraction. Thus, light from the LED modules 1 is efficiently emitted to the outside with almost no diffusion at the inner surface side of the light-transmitting cover 8. Thus, with the LED lamp A1, the number of the LED modules 1 can be reduced, so that the cost for the parts reduces. Further, current to be supplied to the LED modules 1 can be suppressed, which leads to low power consumption.

FIGS. 3-34 show other embodiments of the LED lamp according to the present invention. The elements which are identical or similar to those of the foregoing embodiment are designated by the same reference signs as those used for the foregoing embodiment, and the description is omitted.

Figure 3:
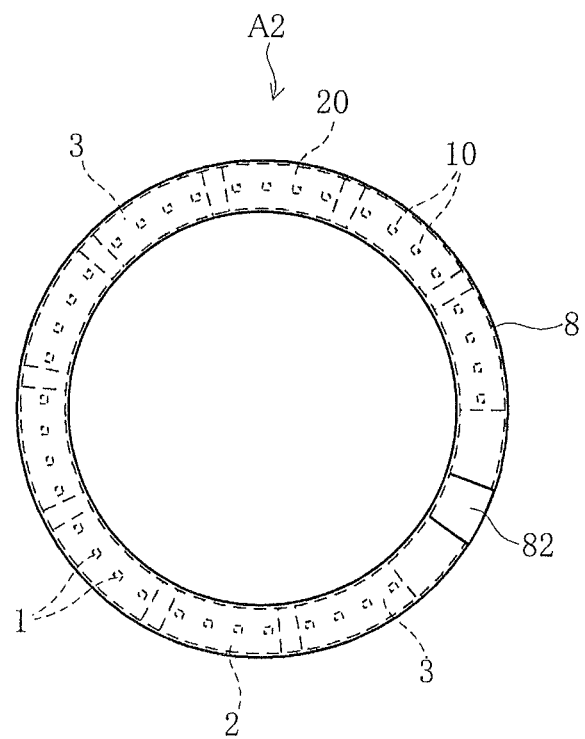
FIG. 3 is a plan view showing an LED lamp according to a second embodiment of the present invention.
Figure 4:
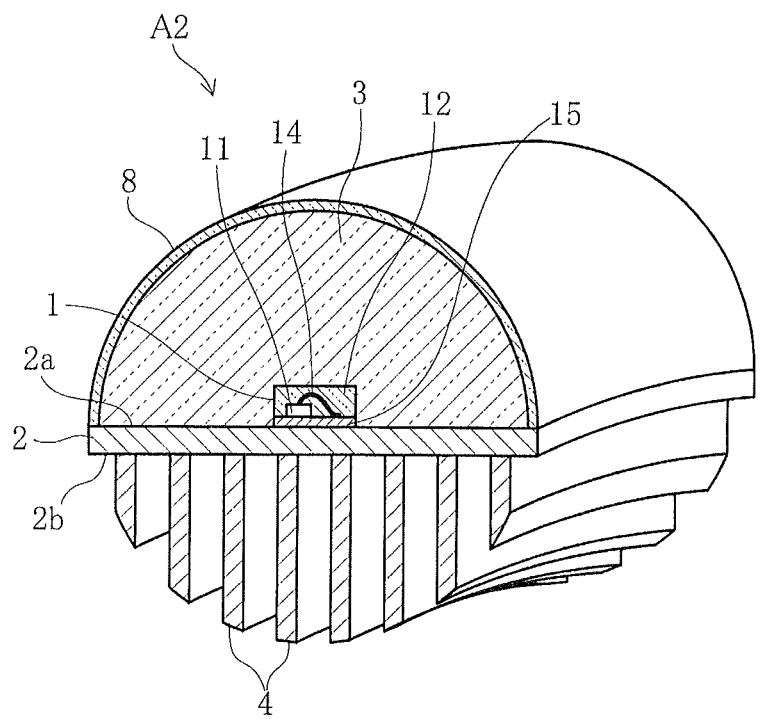
FIG. 4 is a partially-cut-away perspective view of the LED lamp shown in FIG. 3.

FIGS. 3 and 4 illustrate an LED lamp according to a second embodiment of the present invention. The LED lamp A2 of this embodiment has an annular shape as a whole and is attached to a general-use fluorescent lighting fixture as a substitute for e.g. a circular fluorescent lamp. The light-transmitting cover 8 is annular as a whole and in the form of an arc of a semicircle in cross section. A plurality of substrates 2 are curved to conform to the shape of the light-transmitting cover 8. The substrates 2 are arranged along the light-transmitting cover 8. The gap between adjacent substrates 2 or between the substrate 2 and the base 82 may be filled by a plate-like spacer. The heat dissipation members 4 are curved to conform to the shape of the light-transmitting cover 8. Similarly to the foregoing embodiment, the light guide 3 is provided between the mount surfaces 2a of the substrates 2 and the light-transmitting cover 8 in close contact with these and the LED modules 1.

In the LED lamp A2 again, an air space having a considerably different index of refraction does not exist between the light guide 3 and the LED modules 1 or between the light guide 3 and the light-transmitting cover 8. Thus, light from the LED modules 1 is efficiently guided to the outside through the light guide 3. Thus, with the LED lamp A2 again, the number of the LED modules 1 can be reduced, so that the cost for the parts reduces. Further, current to be supplied to the LED modules 1 can be suppressed, which leads to low power consumption.

Figure 5:
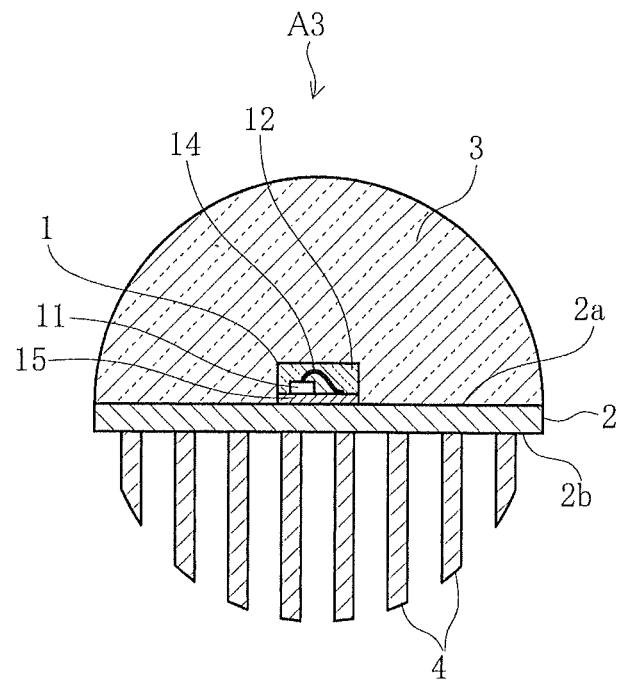
FIG. 5 is a sectional view showing an LED lamp according to a third embodiment of the present invention.

FIG. 5 illustrates an LED lamp according to a third embodiment of the present invention. The LED lamp A3 of this embodiment is different from the foregoing embodiments in that a light-transmitting cover is not provided and the LED modules 1 are covered only by the light guide 3. This LED lamp A3 allows further reduction of the number of the parts, which leads to further reduction of the cost.

Figure 6:
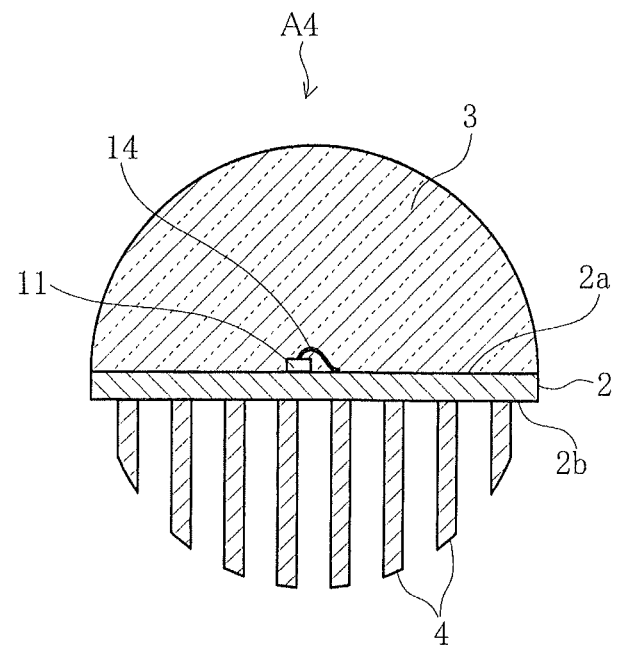
FIG. 6 is a sectional view showing an LED lamp according to a fourth embodiment of the present invention.

FIG. 6 illustrates an LED lamp according to a fourth embodiment of the present invention. The LED lamp A4 of this embodiment is different from the foregoing embodiments in that the light source comprises LED bare chips 11 directly mounted on the substrate 2. The light guide 3 covers the LED bare chips 11 in close contact with the LED bare chips. In order for the LED lamp A4 to emit white light, the LED chips 11 are designed to emit blue light, while the above-described fluorescent material is contained in the light guide 3. Alternatively, LED bare chips 11 that emit red light, green light and blue light may be alternately arranged so that white light is emitted by additive mixing of the colors of light. This LED lamp A4 also allows reduction of the number of the parts, which leads to further reduction of the cost. Moreover, light from the LED bare chips 11 is guided to the outside more efficiently.

The present invention is not limited to the foregoing embodiments.

The specific structure of each part of the LED lamp according to the present invention can be varied in design in many ways. For instance, the entirety or part of the substrate may be accommodated in the light-transmitting cover. The substrate and the heat dissipation members may be integrally formed.

Figure 7:
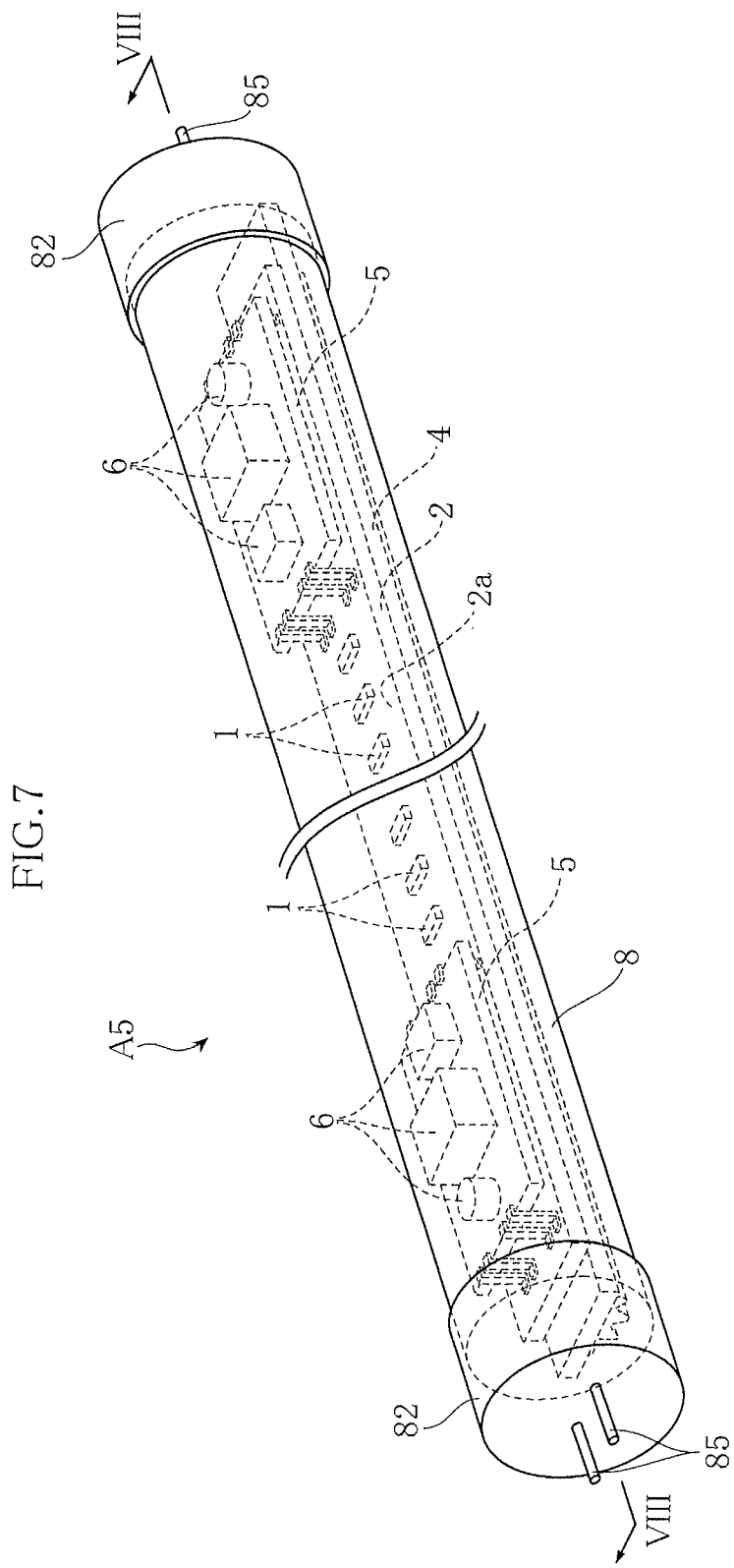
FIG. 7 is a perspective view showing an LED lamp according to a fifth embodiment of the present invention.
Figure 8:
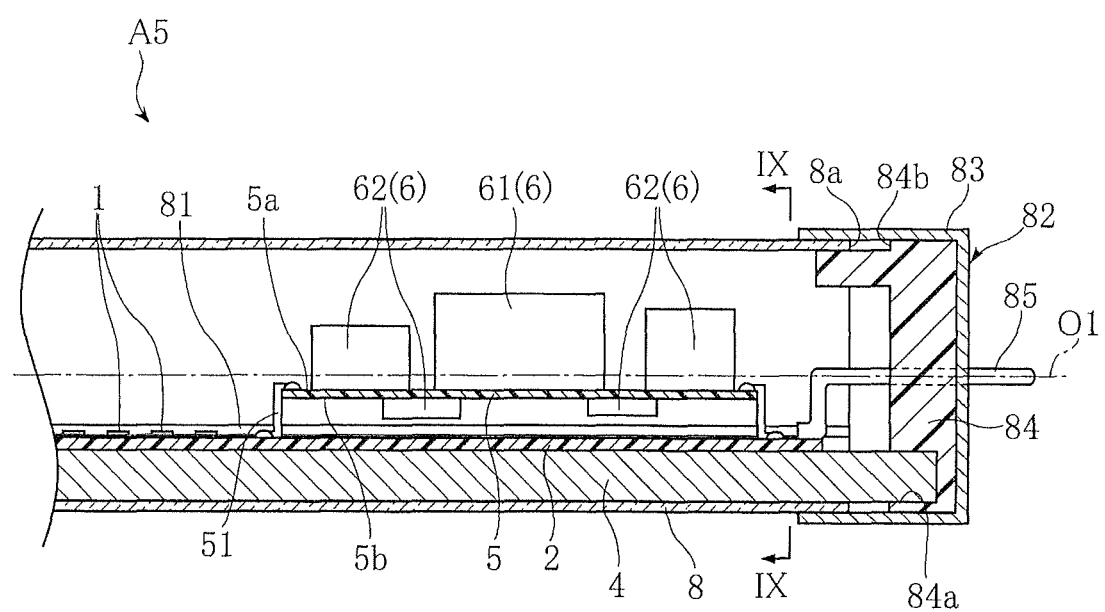
FIG. 8 is a sectional view of a principal portion, taken along lines VIII-VIII in FIG. 7.
Figure 9:
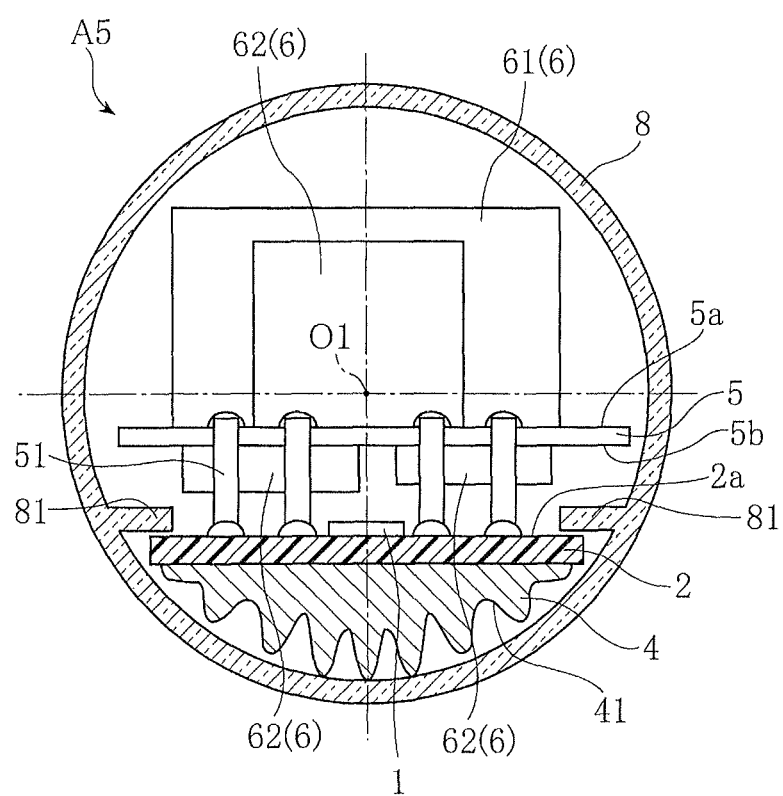
FIG. 9 is an enlarged sectional view taken along lines IX-IX in FIG. 8.

FIGS. 7-9 illustrate an LED lamp according to a fifth embodiment of the present invention. The LED lamp A5 of this embodiment includes a substrate 2, a plurality of LED modules 1, a heat dissipation member 4, power supply substrates 5, a plurality of power supply parts 6, a case 8 and a pair of bases 82. For instance, the LED lamp is used as attached to a general-use fluorescent lighting fixture, as a substitute for a straight-tube fluorescent lamp.

The substrate 2 is made of e.g. glass-fiber-reinforced epoxy resin and has an elongated rectangular shape. A wiring (not shown) is formed at appropriate portions on the surface of the substrate 2. The substrate 2 is laid on the heat dissipation member 4, which will be described later, and attached to the heat dissipation member 4 with e.g. screws.

The LED modules 1 are the light source of the LED lamp A5 and mounted on the mount surface 2a of the substrate 2. The LED modules 1 are arranged side by side at predetermined intervals in the longitudinal direction of the substrate 2 and connected in series by a wiring not shown, for example. As the LED module 1, one packaged for surface mounting and including a white LED is suitably used.

The heat dissipation member 4 is made of e.g. Al and has a long, thin, block-like shape extending in the longitudinal direction of the substrate 2. As shown in FIG. 9, the surface of the heat dissipation member 4 is formed with a plurality of recesses 41 and hence irregular. The recesses 41 extend substantially along the entire length of the heat dissipation member 4 in the longitudinal direction of the substrate 2. The recesses 41 can be formed by making the heat dissipation member 4 with a mold having projections.

Each of the power supply substrates 5 is made of e.g. glass-fiber-reinforced epoxy resin and has an elongated rectangular shape. A wiring (not shown) is formed at appropriate portions on the surface of the power supply substrate 5. The power supply substrate 5 is attached to the substrate 2 by a plurality of leads 51 made of metal. The leads 51 are provided at ends of the power supply substrate 5 spaced in the longitudinal direction, with one end of each lead fixed to the power supply substrate 5 with solder while the other end of the lead soldered to a pad (not shown) provided on the mount surface 2a of the substrate 2. With this arrangement, the power supply substrate 5 is held spaced from the substrate 2 and the heat dissipation member 4. The wiring of the substrate 2 and the wiring of the power supply substrate 5 are electrically connected to each other via the leads 51.

The power supply parts 6 function as a power supply circuit for lighting the LED modules 1 and are mounted on opposite surfaces (the upper surface 5a and the lower surface 5b) of the power supply substrate 5. The power supply parts 6 include an AC/DC converter 61 and other functional parts 62 such as a capacitor or a resistor. The power supply parts are structured to convert alternating current supplied from a commercial power supply into a constant direct current and supply the direct current to the LED modules 1. The AC/DC converter 61 is larger and occupies a larger area than other parts mounted on the power supply substrate 5.

The case 8 accommodates the substrate 2, the heat dissipation member 4 and the power supply substrates 5. As shown in FIG. 9, the case is in the form of a straight tube having a circular cross section. The inner surface of the case 8 is integrally formed with a pair of projections 81 that project inward. Each of the projections 81 is deviated downward (in the radial direction) from the center axis O1 of the case 8. Each projection projects within a plane parallel to the center axis O1 and extends in the direction along the center axis O1. The case 8 having this structure is formed as a single-piece member by extrusion of a synthetic resin such as polycarbonate.

The widths of the substrate 2 and the heat dissipation member 4 and the dimension of the heat dissipation member 4 in the vertical direction are determined so that the substrate 2 and the heat dissipation member 4 can be accommodated in a space below the projections 81 in FIG. 9. As shown in FIG. 9, the movement of the substrate 2 relative to the case 8 in a direction perpendicular to the center axis O1 (upward direction in FIG. 1) is restricted by the contact of the mount surface 2a with the projections 81. The bottom of the heat dissipation member 4 is held in contact with the inner surface of a lower portion of the case 8.

The substrate 2 is located at a position deviated from the center axis O1 of the case 8 in a direction opposite to the mount surface 2a, whereas each power supply substrate 5 is located adjacent to the center axis O1 of the case 8. Thus, the power supply substrate 5 is positioned closer to the center axis O1 than the substrate 2 is. This allows the width of the power supply substrate 5 to be dimensioned larger than that of the substrate 2. The accommodation of the substrate 2, the heat dissipation member 4 and the power supply substrates 5 in the case 8 is performed by inserting the substrate 2 and the heat dissipation member 4 into the space below the projections 81 in the case 8 by sliding movement.

The paired bases 82 are the portions to be fitted to the sockets of a fluorescent lighting fixture for electric power supply from a commercial AC power supply. As shown in FIG. 8, each base 82 includes a cover 83 in the form of a bottomed cylinder, a resin block 84 held in a hollow portion of the cover 83, and two terminals 85. The resin block 84 is formed with a recess 84a. One of the ends of the heat dissipation member 4 spaced in the longitudinal direction is fitted into the recess 84a, whereby the base 82 is attached to the heat dissipation member 4. Thus, in the LED lamp A5, the heat dissipation member 4 is supported by the paired bases 82.

Between the cover 83 and the resin block 84 is defined a gap in the form of part of a cylinder. One of the ends of the case 8 spaced in the longitudinal direction is received in this gap. As shown in FIG. 8, a gap is defined between an end edge 8a of the case 8 in the longitudinal direction and an end edge 84b of the resin block 84. The terminal 85 penetrates the cover 83 and the resin block 84. An end (outer end) of the terminal 85 is to be inserted into an inlet port of the socket of a fluorescent lighting fixture, whereas the other end of the terminal 85 is electrically connected to the wiring of the substrate 2.

The advantages of the LED lamp A5 having the above-described structure are described below.

In use of the LED lamp A5, with the terminals 85 of the bases 82 fitted into the inlet ports of the sockets of a fluorescent lighting fixture, electric power is supplied, whereby the LED modules 1 are turned on.

According to this embodiment, the power supply parts 6 are mounted on opposite surfaces (the upper surface 5a and the lower surface 5b) of the power supply substrate 5. Thus, as compared with the structure in which the power supply parts 6 are mounted only on e.g. the upper surface 5a of the power supply substrate 5, the power supply parts 6 are mounted with a higher efficiency, so that the area of the power supply substrate 5 can be made smaller. Accordingly, the dimension of the power supply substrate 5 in the longitudinal direction along the center axis O1 of the case 8 can be made smaller, which results in the reduction of the non-light-emitting area in the LED lamp A5.

The substrate 2 is located at a position deviated from the center axis O1 of the case 8 in a direction opposite to the mount surface 2a (the surface on which the LED modules 1 are mounted). Thus, when light from the LED modules 1 travels to the outside through the case 8, the light is directed to a range of over 180° in the circumferential direction with respect to the center axis O1 of the case 8. Thus, as compared with the structure in which the substrate 2 is arranged along the center axis O1 of the case 8, the light exiting the case 8 is directed to a larger range, so that the illumination range of the LED lamp A5 is substantially larger. This contributes to the reduction of the non-light-emitting area of the LED lamp A5.

The power supply substrate 5 is positioned closer to the center axis O1 of the case 8 than the substrate 2 is. This allows the dimension of the power supply substrate 5 in the width direction perpendicular to the center axis O1 of the case 8 to be made larger than that of the substrate 2. Thus, the dimension of the power supply substrate 5 in the longitudinal direction along the center axis O1 of the case 8 can be made relatively small. This is suitable for reducing the non-light-emitting area in the LED lamp A5.

In this embodiment, the substrate 2 is laid on the heat dissipation member 4. Thus, heat generated during the lighting of the LED modules 1 is effectively dissipated to the outside through the heat dissipation member 4, whereby deterioration of the LED modules 1 is prevented. Moreover, since the heat dissipation member 4 extends substantially along the entire length of the case 8, the heat dissipation member functions as a structural material of the LED lamp A5. Thus, the provision of the heat dissipation member 4 secures the rigidity of the LED lamp A5.

Since the heat dissipation member 4 is in contact with the inner surface of the case 8, the substrate 2 and the heat dissipation member 4 are supported by the case 8 at three locations. This achieves proper positioning of the substrate 2 relative to the case 8.

Since the case 8 is made of a synthetic resin in this embodiment, the breakage is less likely to occur as compared with a fluorescent lamp comprising a glass tube. Further, as described with reference to FIG. 8, a gap is defined between the end edge 8a of the case 8 and the end edge 84b of the resin block 84 of the base 82. Thus, even when the case 8 undergoes thermal expansion during the lighting of the LED modules 1, the expansion of the case 8 in the longitudinal direction is absorbed, so that unfavorable deformation of the case 8 does not occur.

The power supply substrate 5 is supported by the heat dissipation member 4 via the substrate 2. That is, the power supply substrate 5 is supported in a stable state by the heat dissipation member 4 that can function as a structural material, and is hence stably held at a desired position in the case 8.

In this embodiment, the AC/DC converter 61 is included in the power supply parts 6 that function as the power supply circuit of the LED lamp A5. With this arrangement, a constant direct current for supply to the LED modules 1 is easily generated and hence the structure of the power supply circuit can be simplified. The AC/DC converter 61 is relatively large and occupies a large area. However, the power supply substrate 5 is arranged closer to the center axis O1 of the case 8 relative to the substrate 2. This allows the AC/DC converter 61 mounted on the power supply substrate 5 to be accommodated in the case 8 without coming into contact with the case 8.

A pair of projections 81 are formed on the inner side of the case 8. The movement of the substrate 2 relative to the case 8 in a direction perpendicular to the center axis O1 of the case 8 (radial direction of the case 8) is restricted by the contact of the projection 81 with the mount surface 2a at each end of the substrate 2 in the width direction. Thus, in assembling the LED lamp A5, positioning of the substrate 2 relative to the case 8 is achieved just by inserting the substrate 2 into the case 8. Thus, assembling of the LED lamp A5 is easy.

Figure 10:
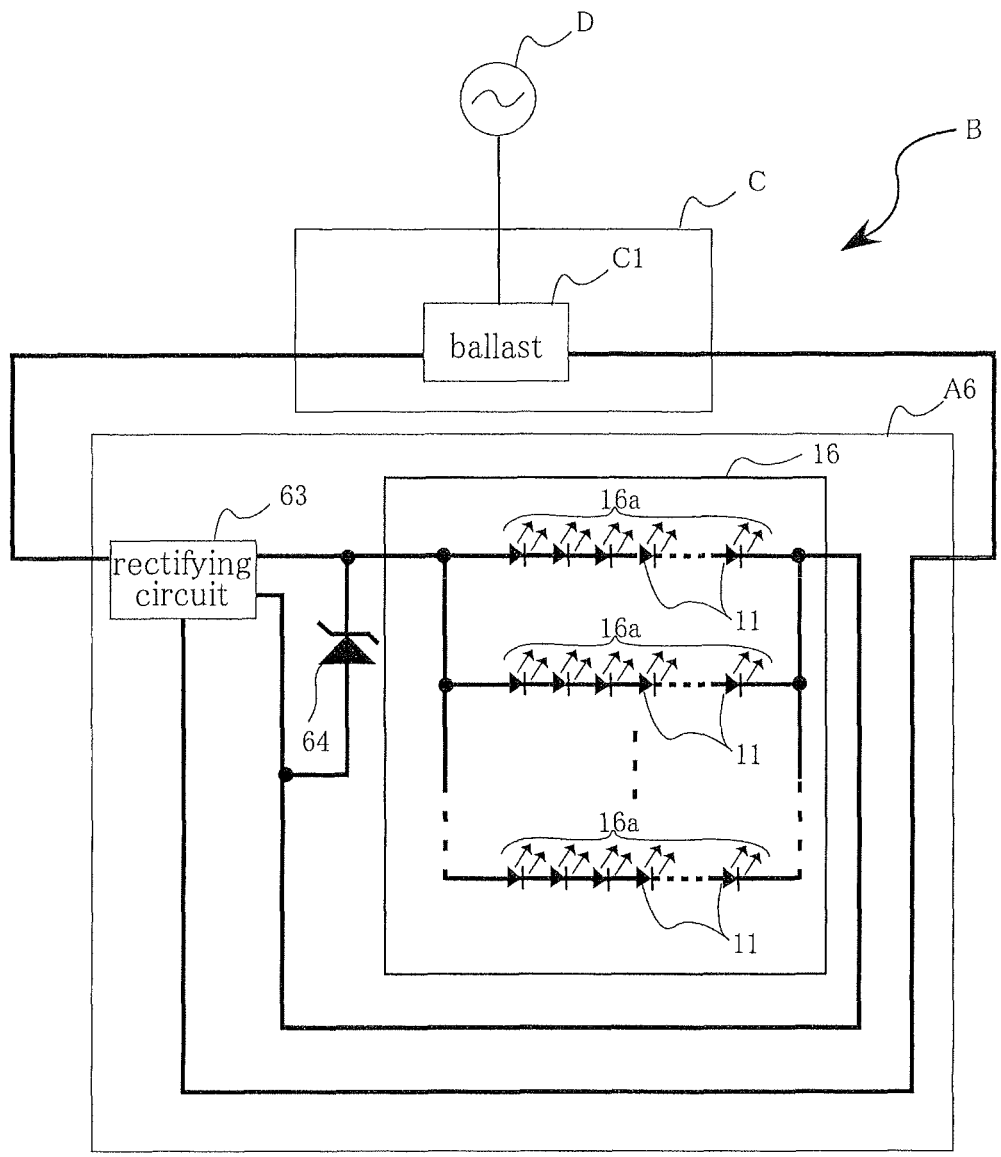
FIG. 10 is a block diagram showing an LED lighting apparatus according to a sixth embodiment of the present invention.

FIG. 10 is a block diagram showing an LED lighting apparatus according to a sixth embodiment of the present invention. The LED lighting apparatus B of this embodiment includes a general-use fluorescent lighting fixture C and an LED lamp A6.

The general-use fluorescent lighting fixture C may be a starter type, which includes a ballast C1 for controlling the alternating current flowing to a fluorescent lamp, a glow starter (not shown) for lighting a fluorescent lamp, and four inlet ports (not shown) for connecting four terminals of a fluorescent lamp. Two of the inlet ports are provided for inputting alternating current into a fluorescent lamp, whereas other two are connected to the glow starter. Since the glow starter is not used in this embodiment, the illustration of the wiring corresponding to the inlet ports connected to the glow starter is omitted in FIG. 10. In this embodiment, it can be considered that the general-use fluorescent lighting fixture C outputs alternating current, inputted from a commercial 100 V power supply D, to the LED lamp A6 via the ballast C1.

The LED lamp A6 is attached to the general-use fluorescent lighting fixture C, and alternating current is inputted from the ballast C1 to the LED lamp. The LED lamp A6 includes a rectifying circuit 63, a protective part 64 and an LED lighting circuit 16.

The rectifying circuit 63 is provided for converting an alternating current inputted from the ballast C1 into a direct current and outputting the direct current. The rectifying circuit 63 comprises a diode bridge (not shown) for performing full-wave rectification. Because of the function of the ballast C1 to stabilize the current, the direct current outputted from the rectifying circuit 63 is a smoothed current. The structure of the rectifying circuit 63 is not limited to this, and any other structures can be employed as long as they can convert alternating current into direct current.

The protective part 64 is provided for preventing a current exceeding a predetermined value from flowing into the LED lighting circuit 16. In this embodiment, the protective part comprises a Zener diode 2, which is energized when a voltage exceeding a predetermined value is applied, to prevent current from flowing to the LED lighting circuit 16. It is only required for the protective part that it is capable of blocking current flowing to the LED lighting circuit 16. Thus, a fuse, for example, can be employed instead. It is to be noted that these parts are provided for the safe use and do not necessarily need to be provided.

The LED lighting circuit 16 emits light when direct current is inputted from the rectifying circuit 63. The LED lighting circuit 16 includes a plurality of LED rows 16a each including a plurality of white LEDs 11 connected in series. The LED rows 16a are connected in parallel with each other and grounded on the cathode side. Each of the white LEDs 11 emits white light when direct current is inputted from the anode side.

The number of the white LEDs 11 in each LED row 16a (hereinafter referred to as "number of serial connections of the LEDs") and the number of the LED rows 16a (hereinafter referred to as "number of parallel connections of the LEDs") are determined in accordance with the specification of the white LEDs 11 and the characteristics of the ballast C1 of the general-use fluorescent lighting fixture C to which the lamp is to be attached. Power consumption changes depending on the number of serial connections of the LEDS, and the characteristics of the change in power consumption depend on the kind of the ballast C1. The number of serial connections of the LEDs is determined appropriately in accordance with the required power consumption. When the number of serial connections of the LEDs is determined, the output current of the ballast C1 is determined. Thus, the number of parallel connections of the LEDs 11 is determined such that the current flowing to each LED 11 does not exceed the rated current.

The advantages of the LED lighting apparatus B are described below.

According to the present embodiment, in accordance with the characteristics of the ballast C1 of the general-use fluorescent lighting fixture to which the lamp is to be attached, the numbers of serial connections and parallel connections of the LEDs are determined such that a predetermined current flows to each of the white LEDs 11. This ensures that a predetermined current flows to the white LEDs 11, without the need for providing a resistor or a constant current circuit in the LED lighting circuit 16. Thus, the efficiency in the use of electric power is enhanced as compared with the structure including a resistor, and the dark area where the LED lighting circuit 16 does not emit light reduces as compared with the structure including a constant current circuit, which leads to reduction of the manufacturing cost.

The LED lighting apparatus according to the present invention is not limited to the foregoing embodiment. The specific structure of each part of the LED lighting apparatus according to the present invention can be varied in design in many ways.

Although the LED lamp A6 is mounted to a starter type general-use fluorescent lighting fixture C in the foregoing embodiment, the present invention is not limited to this. Also with a rapid start type or an inverter type general-use fluorescent lighting fixture C, the present invention can be achieved by appropriately setting the numbers of serial connections and parallel connections of the LEDs in accordance with the characteristics of the ballast C1.

The shape of the LED lamp A6 is not limited, but may be changed in accordance with the general-use fluorescent lighting fixture C to which the lamp is to be attached. For instance, when the LED lamp A6 is to be attached to a general-use fluorescent lighting fixture B for a straight tube fluorescent lamp, the LED lamp is designed to have a shape similar to a straight-tube fluorescent lamp. When the LED lamp A6 is to be attached to a general-use fluorescent lighting fixture C for a circular fluorescent lamp, the LED lamp is designed to have a shape similar to a circular fluorescent lamp. Further, the LED lighting circuit 16 may include red LEDs, green LEDs and blue LEDs, instead of white LEDs 11, to emit white light. The LED lighting circuit may be designed to emit light other than white light.

Figure 11:
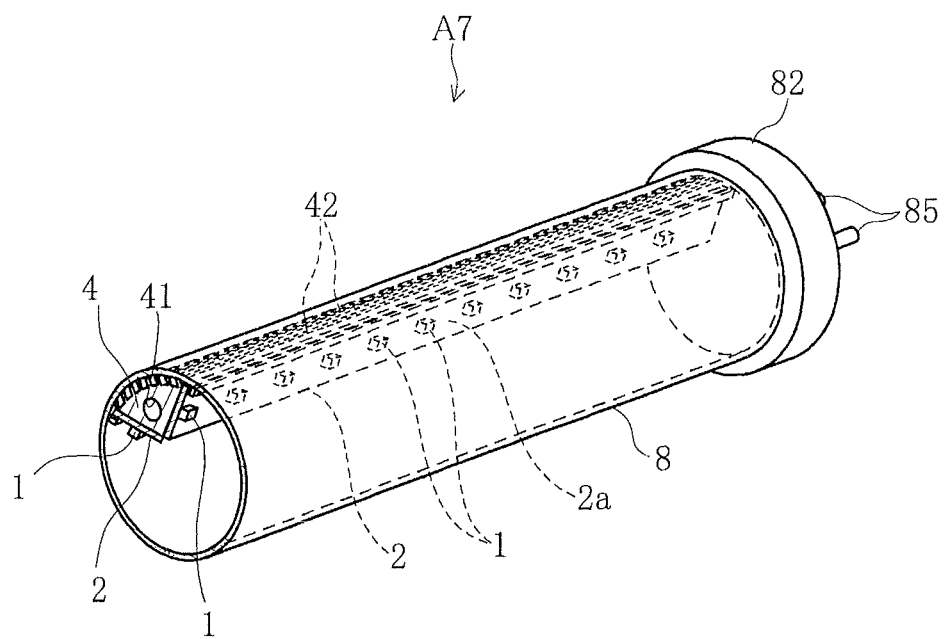
FIG. 11 is a partially-cut-away perspective view of an LED lamp according to a seventh embodiment of the present invention.
Figure 12:
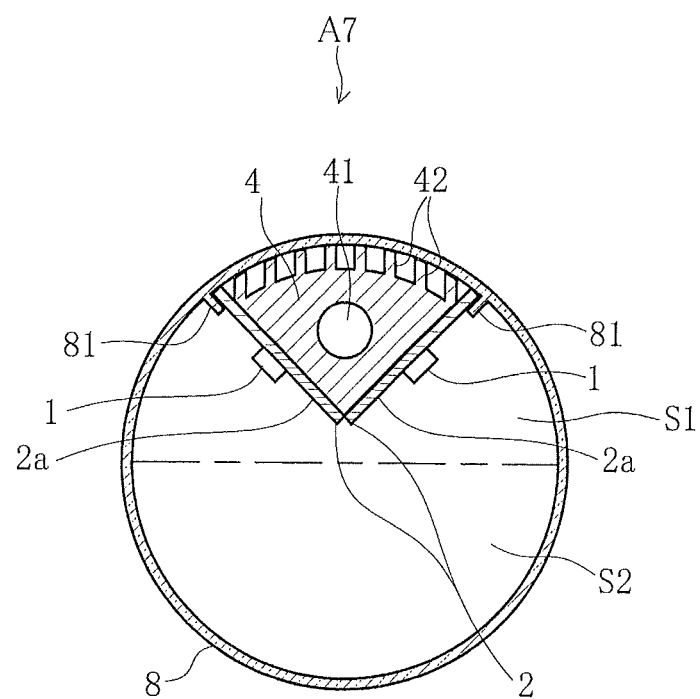
FIG. 12 is a sectional view of the LED lamp shown in FIG. 11.
Figure 13:
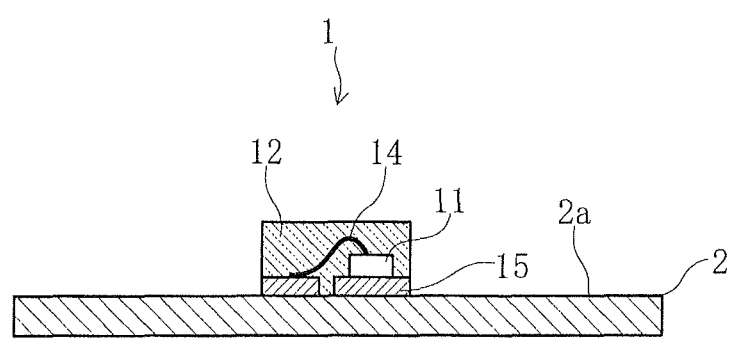
FIG. 13 is a sectional view of an LED module provided in the LED lamp shown in FIG. 11.

FIGS. 11-13 illustrate an LED lamp according to a seventh embodiment of the present invention. The LED lamp A7 of this embodiment includes a plurality of LED modules 1, two substrates 2, a light-transmitting cover 8, a heat dissipation member 4 and bases 82 and has an elongated cylindrical shape as a whole. The LED lamp A7 has an appearance similar to that of a straight-tube fluorescent lamp and is to be attached to a general-use fluorescent lighting fixture.

The LED modules 1 are mounted on the mount surface 2a of each substrate 2 at predetermined intervals in a row. As shown in FIG. 13, each of the LED modules 1 is made up of an LED bare chip 11, a resin package 12 protecting the bare chip, and a base member 15 supporting the LED bare chip 11 while being electrically connected to the LED bare chip by a bonding wire 14. For instance, the LED bare chip 11 is made of a GaN-based semiconductor and emits blue light. The resin package 12 is made of e.g. silicone resin that transmits light. The resin package 12 contains a fluorescent material that emits yellow light when excited by blue light, for example. As the fluorescent material, a green fluorescent material and a red fluorescent material can be used to achieve a high color rendering index. The base member 15 is bonded to the substrate 2 as electrically connected to a wiring pattern (not shown) of the substrate 2, for example.

The substrate 2 is made of e.g. Al and has an elongated rectangular shape that can be inserted into the light-transmitting cover 8 in the axial direction. As shown in FIG. 12, the two substrate 2 are accommodated in such a manner as to define a cross section in the form of a sector together with an upper circumferential part of the light-transmitting cover 8 when the interior of the light-transmitting cover 8 is viewed in the axial direction (in the direction penetrating the sheet surface of the figure). The upper circumferential part of the light-transmitting cover 8 forms an arc of the sector, whereas the two substrates 2 form two sides of the sector. In this embodiment, the two substrates 2 form a substantially right angle. Provided that the internal space of the light-transmitting cover 8 is divided into an upper portion and a lower portion along the line of a diameter (the straight dashed line in FIG. 12), the two substrates 2 are accommodated within the upper semicircular region S1. The mount surface 2a of each substrate 2 is substantially oriented toward the lower semicircular region S2. The light emitted from each substrate 2 travels in various directions and mostly travels from inside of the light-transmitting cover 8 downward through the circumference of the light-transmitting cover 8. The heat dissipation member 4 is provided on the reverse surfaces of the substrates 2. The heat dissipation member 4 is placed in the space that is in the form of a sector in cross section and enclosed by the upper circumferential part of the light-transmitting cover 8 and the two substrates 2.

The light-transmitting cover 8 has an elongated cylindrical shape made by e.g. extrusion of polycarbonate resin. The light-transmitting cover 8 serves to protect the two substrates 2 and diffuse light traveling from each substrate 2. Ribs 81 for positioning and fixing the substrates 2 are integrally formed on the inner surface of an upper portion of the light-transmitting cover 8. The substrates 2 are bonded and fixed to the ribs 81, thereby defining a sectoral cross section together with the upper circumferential part of the light-transmitting cover 8.

The heat dissipation member 4 is made of e.g. Al similarly to the substrate 2 and made integral with the two substrates 2. The heat dissipation member 4 is formed with a through-hole 41 and recesses 42. The through-hole 41 extends in the axial direction of the light-transmitting cover 8. The recesses 42 are in the form of folds formed on the outer surface close to the upper circumferential part of the light transmitting cover 8. With this arrangement, the heat dissipation member 4 has a relatively large area for coming into contact with air, and hence efficiently dissipates the heat generated at the substrate 2.

The base 82 is a portion to be fitted into an inlet port of a general-use fluorescent lighting fixture and includes terminals 85 for current supply. The base 82 is attached to each of the ends spaced in the longitudinal direction of the light-transmitting cover 8 (only one end is shown in FIG. 11), and each terminal 85 is connected to a wiring pattern (not shown) on the substrate 2. By fitting each terminal 85 into the inlet port of a fluorescent lighting fixture, electric power is supplied to the LED modules 1 on the substrate 2, whereby the LEDs are turned on.

The advantages of the LED lamp A7 are described below.

In the LED lamp A7, most part of the light from the right substrate 2 in FIG. 12 travels from inside of the light-transmitting cover 8 to the lower right side and passes through the circumference of the light-transmitting cover 8 to be emitted toward the lower right side. On the other hand, most part of the light from the left substrate 2 in FIG. 12 travels from inside of the light-transmitting cover 8 to the lower left side and passes through the circumference of the light-transmitting cover 8 to be emitted toward the lower left side.

With this arrangement, when the LED lamp A7 is attached to a ceiling with the upper semicircular region S1 positioned on the ceiling side, only a small amount of light travels toward the ceiling, and light is efficiently diffused downward into the space in the room rather than toward the ceiling.

Thus, with the LED lamp A7 of this embodiment, even when each LED modules 1 has a directivity of light, light is emitted in the downward direction in which each substrate 2 is oriented, whereby efficient and uniform illumination is achieved.

Figure 14:
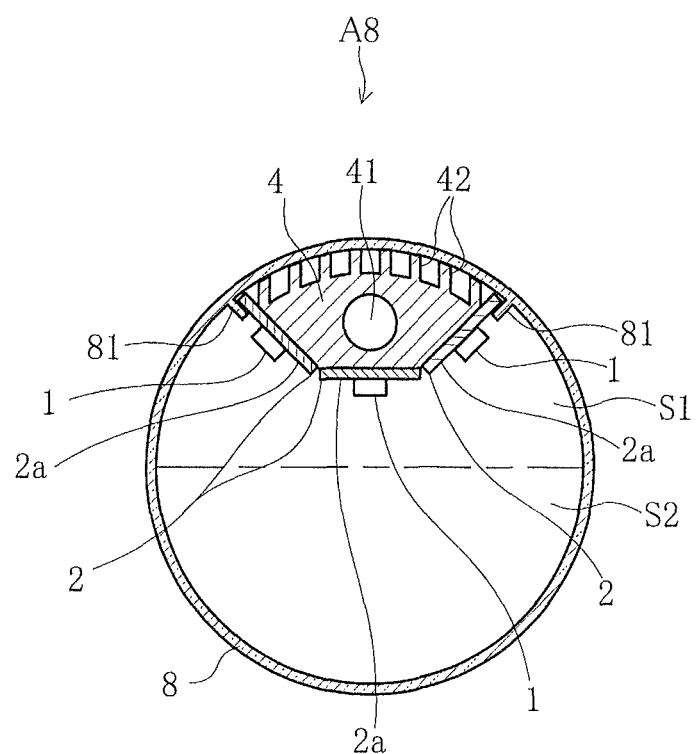
FIG. 14 is a sectional view showing an LED lamp according to an eighth embodiment of the present invention.

FIG. 14 illustrates an LED lamp according to an eighth embodiment of the present invention. The elements which are identical or similar to those of the foregoing embodiment are designated by the same reference signs as those used for the foregoing embodiment, and the description is omitted.

The LED lamp A8 shown in FIG. 14 includes three substrates 2. These substrates 2 are accommodated in such a manner as to define a cross section substantially in the form of a sector together with an upper circumferential part of the light-transmitting cover 8 when the interior of the light-transmitting cover 8 is viewed in the axial direction. The substrates 2 form two sides of the sector and a shorter side provided at a position corresponding to the apex angle of the sector. In this embodiment, the mount surfaces 2a of the substrates 2 on the two sides are oriented obliquely downward, whereas the mount surface 2a of the central substrate 2 is oriented vertically downward. These three substrates 2 are accommodated in the upper semicircular region S1. With this LED lamp A8, the substrates 2 allow emission of light in many directions, which leads to further uniform illumination.

Figure 15:
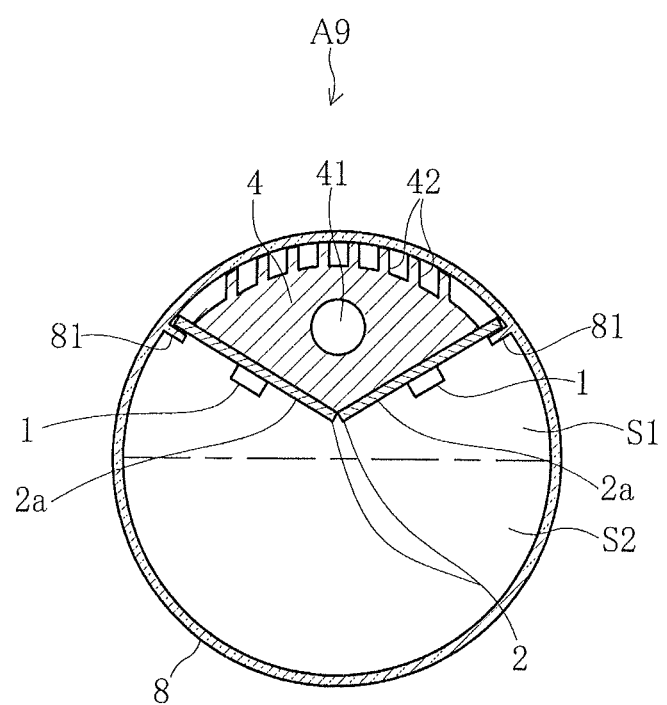
FIG. 15 is a sectional view showing an LED lamp according to a ninth embodiment of the present invention.

FIG. 15 illustrates an LED lamp according to a ninth embodiment of the present invention. In the LED lamp A9 of this embodiment, the two substrates 2 are arranged to form an obtuse angle. With this LED lamp A9, the mount surface 2a of each substrate 2 is oriented more downward, so that light is emitted downward more efficiently.

The present invention is not limited to the foregoing embodiments.

The specific structure of each part of the LED lamp according to the present invention can be varied in design in many ways. For instance, the light-transmitting cover may have an opening at a portion adjacent to the heat dissipation member, and part of the heat dissipation member may be exposed from the light-transmitting cover.

The LED module may have a simple structure in which an LED chip is electrically connected to a wiring pattern of an LED substrate by wire bonding.

The LED substrate and the heat dissipation member may be bonded to each other.

A light guide for diffusing light from the LED substrate to the outside may be provided in the internal space of the light-transmitting cover.

FIGS. 16-19 illustrate an LED lamp according to a tenth embodiment of the present invention. The LED lamp A10 of this embodiment includes a substrate 2, a plurality of LED modules 1, a light-transmitting cover 8 and a pair of bases 82. For instance, the lamp is used as attached to a general-use fluorescent lighting fixture as a substitute for a straight-tube fluorescent lamp for e.g. a FL40W type (tube length 1198 mm).

The substrate 2 is made of e.g. glass-fiber-reinforced epoxy resin and has an elongated rectangular shape. Preferably, in this embodiment, the substrate 2 is a multi-layer substrate comprising lamination of an insulating layer and wiring layers. The wiring layers are electrically connected to each other via a through hole formed in the insulating layer. A predetermined wiring pattern (not shown) is formed on the surface of the substrate 2 and on the wiring layer sandwiched between the insulating layers.

The LED modules 1 are the light source of the LED lamp A10 and mounted on the obverse surface (upper surface 1a) of the substrate 2. The LED modules 1 are aligned at predetermined intervals in the longitudinal direction of the substrate 2. As the LED module 1, one including e.g. a white LED and packaged for surface mounting is suitably used. A heat dissipation member (not shown) made of e.g. Al may be provided on the reverse surface of the substrate 2 (the surface opposite to the surface on which the LED modules 1 are mounted) to efficiently dissipate the heat generated during the lighting of the LED modules 1.

In this embodiment, the LED modules 1 include a plurality of first LED modules 17A and a plurality of second LED modules 17B. The first LED modules 17A have a larger size and a higher brightness than the second LED modules 17B and serve as the main light source of the LED lamp A10. The second LED modules 17B have lower power consumption than the first LED modules 17A and serve as the auxiliary light source of the LED lamp A10.

Figure 16:
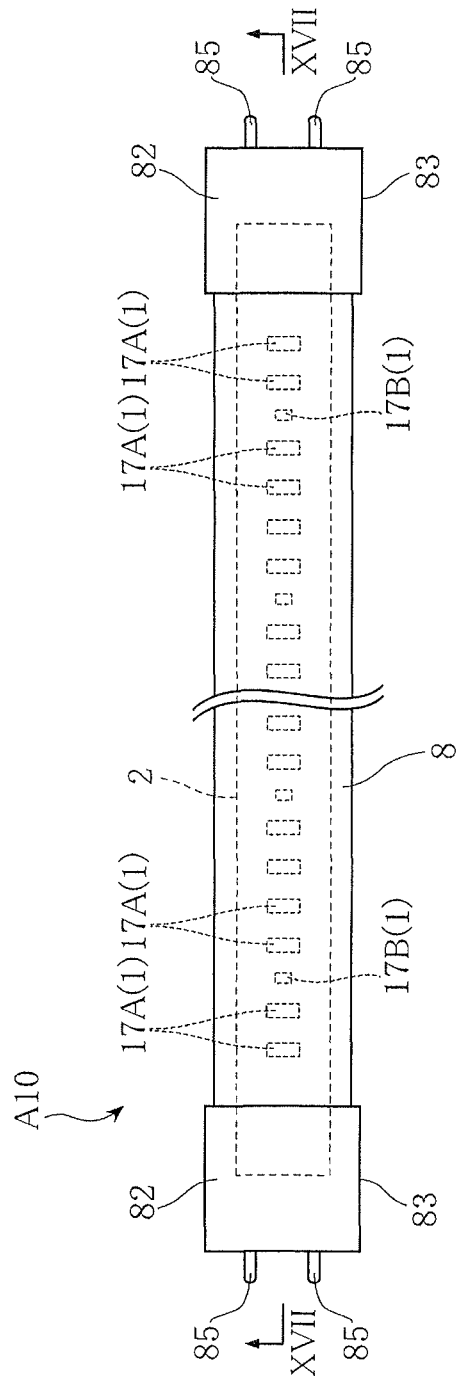
FIG. 16 is a plan view showing an LED lamp according to a tenth embodiment of the present invention.
Figure 17:
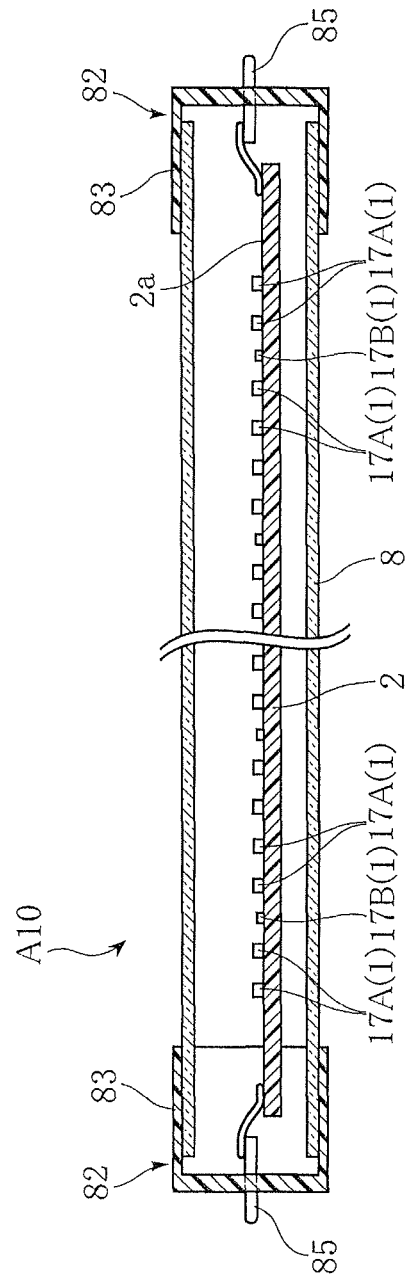
FIG. 17 is a sectional view taken along lines XVII-XVII in FIG. 16.
Figure 18:
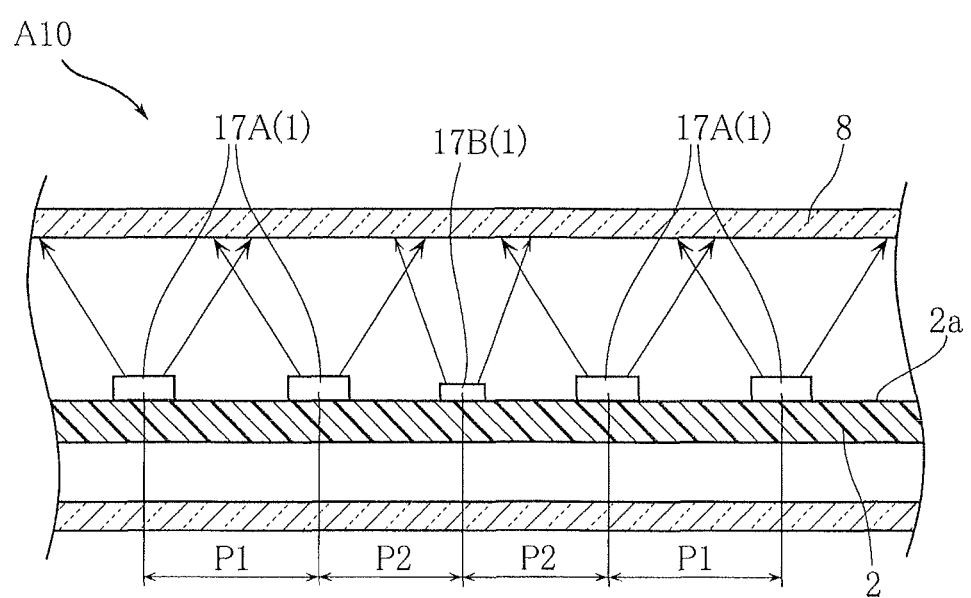
FIG. 18 is an enlarged sectional view of a principal portion showing the light emission state of the LED lamp of FIG. 16.

As shown in FIGS. 16 and 17, at least two first LED modules 17A (generally four in this embodiment) are arranged between adjacent second LED modules 17B. Each of the second LED modules 17B is placed at the intermediate position between adjacent first LED modules 17A. For instance, the interval P1 between adjacent first LED modules 17A is e.g. about 3.6 mm (see FIG. 18). The interval P2 between the second LED module 17B and the first LED module 17A is smaller than the interval P1 and about 3.0 mm, for example.

The light-transmitting cover 8 accommodates the substrate 2 on which the LED modules 1 are mounted and is in the form of a straight cylinder. Projections or grooves (not shown) for engagement with the substrate 2 are formed on the inner surface of the light-transmitting cover 8. Thus, the substrate 2 is held at a predetermined position relative to the light-transmitting cover 8. The light-transmitting cover 8 having this structure is formed as a single-piece member by extrusion of a light-transmitting synthetic resin such as polycarbonate.

The paired bases 82 are the portions to be fitted to the sockets of a fluorescent lighting fixture for electric power supply from a commercial AC power supply. The bases are attached to ends of the light-transmitting cover 8 spaced in the longitudinal direction. Each base 82 includes a cover 83 in the form of a bottomed cylinder and two terminals 85. The terminals 85 penetrate the cover 83. An end (outer end) of the terminal 85 is to be inserted into an inlet port of the socket of a fluorescent lighting fixture, whereas the other end of the terminal 85 is electrically connected to the wiring of the substrate 2.

Figure 19:
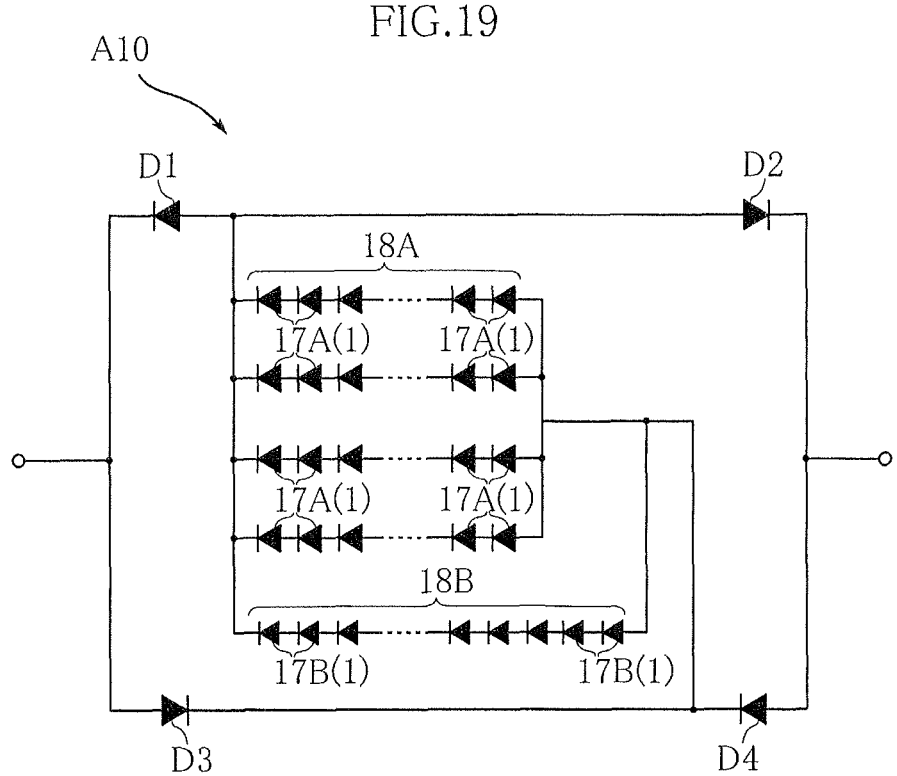
FIG. 19 is a circuit diagram showing the electric structure of the LED lamp of FIG. 16.

As will be understood from FIG. 19 showing the electrical connection, the first LED modules 17A are so arranged that a plurality first LED series connection portions 18A, each consisting of a predetermined number of first LED modules 17A connected in series, are connected in parallel with each other. In this embodiment, four first LED series connection portions 18A are connected in parallel with each other, and each of the first LED series connection portions 18A consists of 65 first LED modules 17A.

As shown in FIG. 19, the second LED modules 17B are connected in series to form a second LED series connection portion 18B. The second LED series connection portion 18B and the first LED series connection portion 18A are connected in parallel with each other.

The number of the second LED modules 17B constituting the second LED series connection portion 18B is larger than the number of the first LED modules 17A constituting the first LED series connection portion 18A (65 in this embodiment) and may be 69, for example. Four diodes D1-D4 constituting a bridge rectifier circuit are connected to the first LED series connection portions 18A and the second LED series connection portion 18B.

The circuit structure shown in FIG. 19 is achieved by the wiring of a predetermined pattern on the substrate 2 structured as a multi-layer substrate.

In the use of the LED lamp A10 having the above-described structure, when an AC voltage is applied to the circuit shown in FIG. 19, a full-wave rectified current in the forward direction flows to all the LED modules 1 (the first LED modules 17A and the second LED modules 17B). Since the first LED modules 17A are so arranged that a plurality of series connection portions consisting of the same number of first LED modules 17A are connected in parallel with each other, their electrical conditions (drop voltage, current and power consumption) are the same, so that the LED modules emit light uniformly. When each first LED series connection portion 18A consists of 65 first LED modules 17A, the drop voltage, current and power consumption of each first LED module 17A may be about 3 V, about 20 mA and about 60 mW, respectively. In this case, the drop voltage at the first LED series connection portion 18A is about 195V.

Since the second LED series connection portion 18B is connected in parallel with the plurality of first LED series connection portion 18A, the drop voltage at the second LED series connection portion 18B is equal to that of the first LED series connection portion 18A. When the second LED series connection portion 18B consists of 69 second LED modules 17B, the drop voltage, current and power consumption of each second LED module 17B may be about 2.7 V, about 10 mA and about 27 mW, respectively.

According to this embodiment, to reduce the interval between adjacent LED modules 1 by increasing the total number of the LED modules, both the first LED modules 17A and the second LED modules 17B are increased. This suppresses the increase of power consumption of the entire LED lamp A10, as compared with the case where only the number of the first LED modules 17A is increased.

Since the current consumption of the second LED modules 17B is smaller than that of the first LED modules 17A, the brightness of the second LED modules is also lower. However, as described above with reference to FIG. 18, the interval P2 between the second LED module 17B and the first LED modules 17A is smaller than the interval P1 between adjacent two first LED modules 17A. This arrangement efficiently reduces the non-uniformity of brightness as compared with the case where all the LED modules 1 (the first LED modules 17A and the second LED modules 17B) are arranged at equal intervals.

Further, as described above, all the first LED modules 17A are under the same electrical conditions and hence emit light uniformly. This is suitable for reducing the non-uniformity of brightness of the LED lamp A10.

The LED lamp of the present invention is not limited to the foregoing embodiment. The specific structure of each part of the LED lamp according to the present invention can be varied in design in many ways.

Although the LED modules 1 are mounted on the substrate 2 in the foregoing embodiment, the substrate may be dispensed with. For instance, a heat dissipation member extending in the longitudinal direction of the LED lamp may be provided, and LED modules may be mounted on the heat dissipation member via an insulating film.

Figure 20:
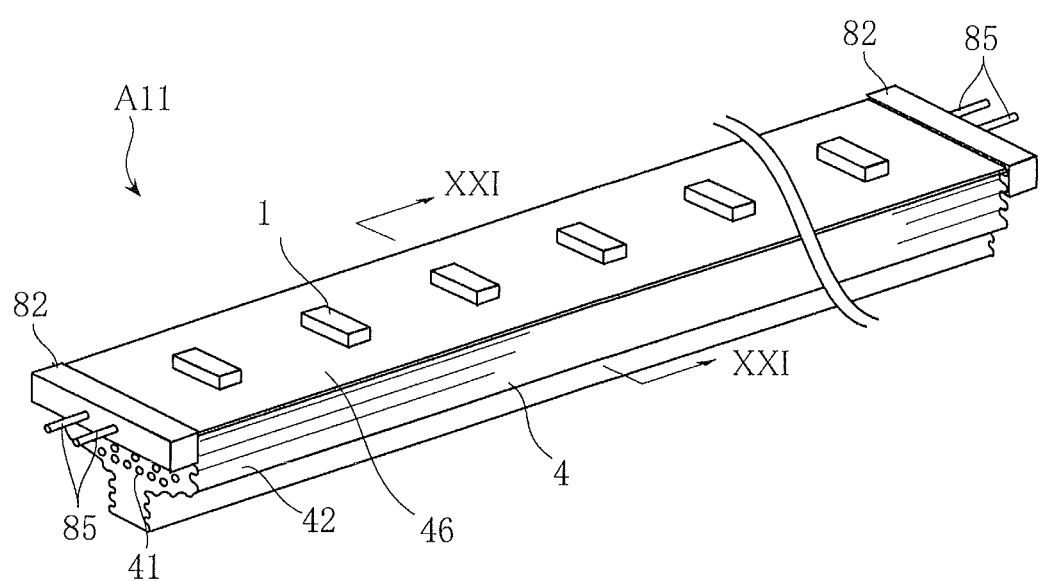
FIG. 20 is a perspective view showing an LED lamp according to an eleventh embodiment of the present invention.
Figure 21:
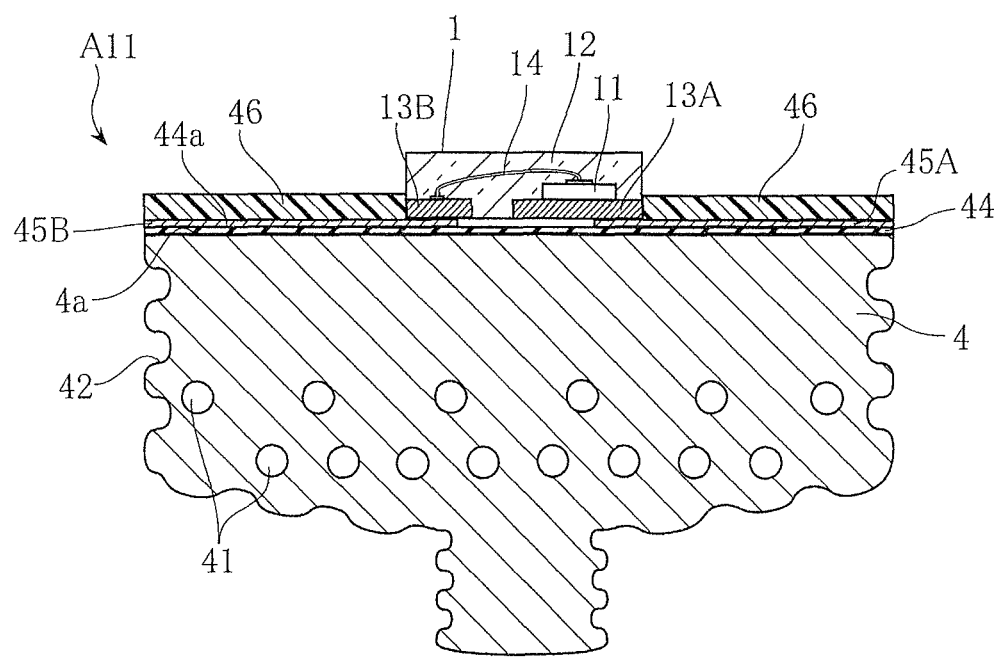
FIG. 21 is a sectional view of a principal portion, taken along lines XXI-XXI in FIG. 20.

FIGS. 20 and 21 show an LED lamp according to an eleventh embodiment of the present invention. The LED lamp A11 of this embodiment includes a heat dissipation member 4, an insulating layer 44, metal wiring layers 45A-45B, LED modules 1 and bases 82. The LED lamp A11 of this embodiment is accommodated in a cylindrical case not shown, and is used as attached to a general-use fluorescent lighting fixture, e.g. as a substitute for a fluorescent lamp.

The heat dissipation member 4 supports the LED modules 1 mounted on it and dissipates the heat generated at the LED modules 1. The heat dissipation member 4 is made of e.g. Al and substantially in the form of a thin elongated plate extending in a predetermined direction. The heat dissipation member 4 has a flat upper surface $4a$. A plurality of recesses 42 are formed on the side surfaces of the heat dissipation member 4. The recesses 42 extend throughout the entire length of the heat dissipation member 4 in the longitudinal direction of the heat dissipation member 4. The recesses 42 are provided for increasing the surface area of the heat dissipation member 4. The recesses 42 can be formed by making the heat dissipation member 4 by using a mold having projections. The heat dissipation member 4 is further formed with a plurality of through-holes 41 penetrating the heat dissipation member 4 in the longitudinal direction. The through-holes 41 are also provided for increasing the surface area of the heat dissipation member 4.

An insulating layer 44 is laid on the upper surface $4a$ of the heat dissipation member 4. The insulating layer 44 electrically insulates the heat dissipation member 4 from the metal wiring layers 45A, 45B. The insulating layer 44 is made of e.g. $SiO_2$. The thickness of the insulating layer 44 is e.g. about 100 μm. The insulating layer 44 can be formed by CVD or PVD represented by sputtering.

The insulating layer 44 has a wiring pattern made of e.g. Cu on the upper surface $44a$. The wiring pattern is made of metal wiring layers 45A and 45B spaced from each other. The metal wiring layers 45A and 45B are laid on the upper surface $44a$ of the insulating layer 44. The metal wiring layers 45A and 45B are obtained by forming a film of Cu on the upper surface $44a$ of the insulating layer 44 and then etching the film. The metal wiring layers 45A and 45B are covered with a protective layer 46. The metal wiring layers 45A and 45B are electrically insulated from the heat dissipation member 4 by the insulating layer 44.

The LED modules 1 are supported by the heat dissipation member 4. Each of the LED modules 1 includes an LED bare chip 11, leads 13A-13B made of metal and spaced from each other, a wire 14 and a resin package 12. As shown in FIG. 20, the LED modules 1 are arranged side by side in the longitudinal direction of the heat dissipation member 4. Each of the LED modules 1 is placed such that the main light emission direction of the LED bare chip 11 is perpendicular to the upper surface 4a of the heat dissipation member 4.

For instance, the LED bare chip 11 has a lamination structure made up of an n-type semiconductor, a p-type semiconductor, and an active layer sandwiched between these (none of these are shown). When the LED bare chip 11 is made of a GaN-based semiconductor, it emits blue light.

The LED bare chip 11 is provided with two electrodes. These electrodes are formed on the lower surface and the upper surface of the LED bare chip 11. The LED bare chip 11 is mounted on the obverse surface of the lead 13A. The reverse surface of the lead 13A is bonded to the metal wiring layer 45A. Thus, the electrode on the lower surface of the LED bare chip 11 is electrically connected to the metal wiring layer 45A. The electrode on the upper surface of the LED bare chip 11 is connected to the lead 13B via the wire 14. The lead 13B is bonded to the metal wiring layer 45B. Thus, the electrode on the upper surface of the LED bare chip 11 is electrically connected to the metal wiring layer 45B.

The resin package 12 protects the LED bare chip 11 and the wire 14. The resin package 12 is made of e.g. silicone resin that transmits light emitted from the LED bare chip 11. In the case where the resin package 12 contains a fluorescent material that emits yellow light when excited by blue light, white light is emitted from the LED module 1. Instead of the fluorescent material that emits yellow light, a fluorescent material that emits green light and a fluorescent material that emits red light may be mixed in the resin package.

The bases 82 are attached to the ends of the heat dissipation member 4 spaced in the longitudinal direction and include terminals 85. Each of the terminals 85 is electrically connected to the metal wiring layer 45A or 45B. By fitting each terminal 85 into the inlet port of the fluorescent lighting fixture, electric power is supplied to the LED modules 1, whereby the LED bare chips 11 are turned on.

The advantages of the LED lamp A11 are described below.

According to this embodiment, when the LED lamp A11 is turned on, heat is generated at the LED bare chip 11. The heat generated at the LED bare chip 11 is transferred to the metal wiring layer 45A through the lead 13A. The heat transferred to the metal wiring layer 45A is transferred to the heat dissipation member 4 through the insulating layer 44. Since the heat dissipation member 4 has a large contact area with the outside due to the provision of recesses 42 and through-holes 41, the heat transferred to the heat dissipation member is quickly dissipated to the outside.

Thus, with the structure of the LED lamp A11, the heat generated at the LED bare chips 11 is efficiently transferred to the heat dissipation member 4, and the heat transferred to the heat dissipation member 4 is further dissipated efficiently to the outside air. Thus, the LED lamp A11 prevents the temperature of the LED modules 1 from increasing excessively, so that the LED lamp is unlikely to break, and hence provides stable illumination.

Further, in the LED lamp A11, the heat dissipation member 4 serves also as a substrate for mounting the LED modules 1. Thus, a substrate for mounting LED modules 1 does not need to be provided in addition to the heat dissipation member 4, which leads to the reduction of the cost for the parts.

Figure 22:
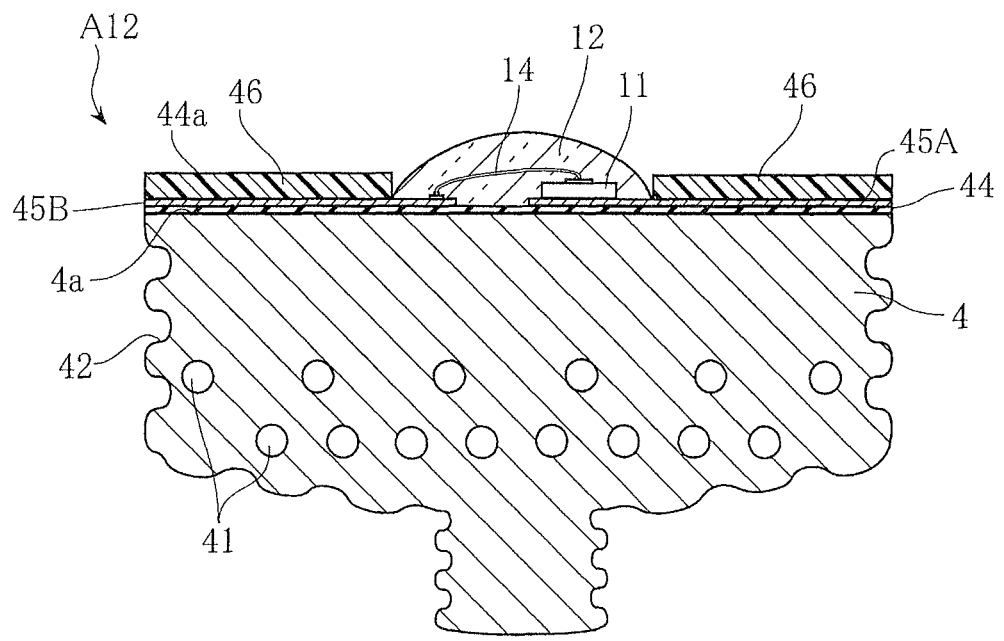
FIG. 22 is a sectional view of a principal portion of an LED lamp according to a twelfth embodiment of the present invention.

FIG. 22 illustrates an LED lamp according to a twelfth embodiment of the present invention. Unlike the LED lamp A11 in which the LED bare chip 11 is electrically connected to the metal wiring layer 45A via the lead 13A, the LED lamp A12 of this embodiment is structured such that the LED bare chip 11 is directly mounted on and electrically connected to the metal wiring layer 45A.

In this embodiment, the LED bare chip 11 is directly bonded onto the metal wiring layer 45A without the intervention of the lead 13A. The wire 14 connected to the electrode on the upper surface of the LED bare chip 11 is directly bonded to the metal wiring layer 45B. The LED bare chip 11 and the wire 14 are covered with e.g. potting resin 12 formed by potting a resin that transmits light such as an epoxy resin.

With the LED lamp A12 of this embodiment, the heat generated at the LED bare chip 11 is quickly transferred to the metal wiring layer 45A, and the heat transferred to the metal wiring layer 45A is transferred to the heat dissipation member 4 through the insulating layer 44. Thus, as compared with the LED lamp A11 of the eleventh embodiment in which the heat generated at the LED bare chip 11 is transferred through the lead 13A, heat is transferred to the heat dissipation member 4 more quickly and efficiently. Thus, the heat dissipation effect is enhanced.

Figure 23:
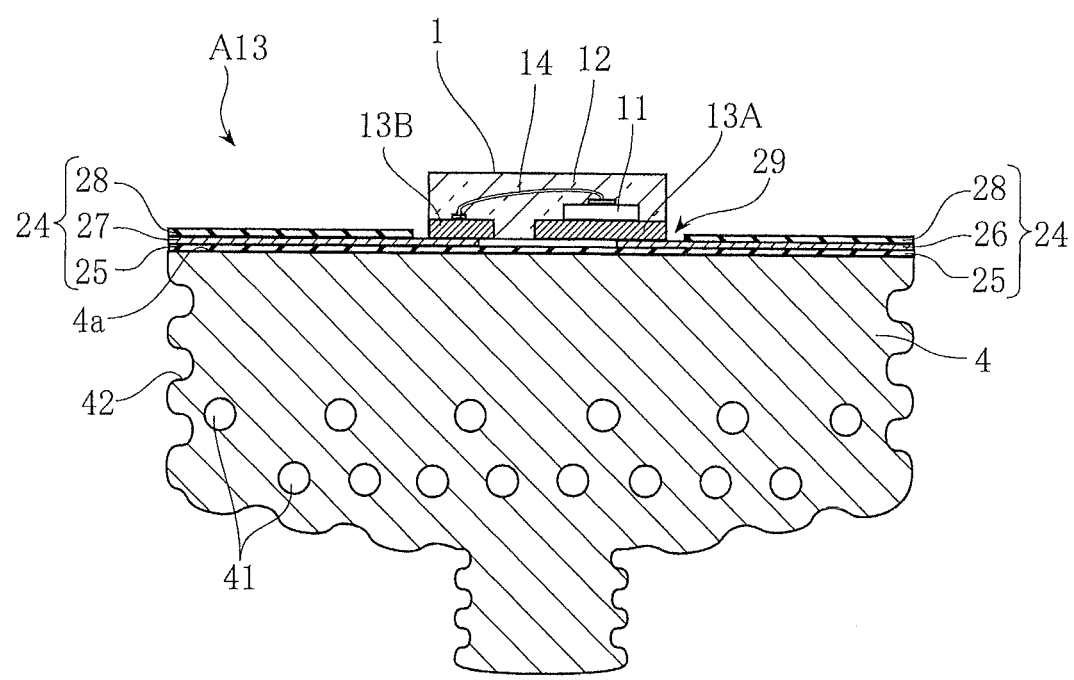
FIG. 23 is a sectional view of a principal portion of an LED lamp according to a thirteenth embodiment of the present invention.

FIG. 23 illustrates an LED lamp according to a thirteenth embodiment of the present invention. The LED lamp A13 of this embodiment is different from the LED lamps A11 and A12 of the eleventh and the twelfth embodiments in that a flexible wiring substrate 24 is provided instead of the insulating layer 44 and the metal wiring layers 45A, 45B. In this embodiment, the flexible wiring substrate 24, which is in the form of a film, is arranged on the upper surface 4a of the heat dissipation member 4.

The flexible wiring substrate 24 is made up of a base film layer 25, metal wiring layers 26 and 27 spaced from each other, and a cover coat layer 28, which are integrally laminated into a film shape as a whole. The base film layer 25 is made of e.g. polyimide and functions as an electrical insulating layer. The metal wiring layers 26 and 27 are made of e.g. Cu and function as a wiring pattern. The cover coat layer 28 is made of an electrically insulating material and protects the metal wiring layers 26 and 27.

The flexible wiring substrate 24 includes a predetermined region 29 where the cover coat layer 28 does not cover the metal wiring layers 26 and 27. In this region 29, the metal wiring layers 26 and 27 are exposed to the outside. The portion of the metal wiring layers 26 and 27 exposed to the outside in this region 29 may be used as an external terminal. Further, the LED module 1 is mounted on the metal wiring layers 26 and 27 at portions exposed in the region 29. That is, as shown in FIG. 23, the lead 13A of the LED module 1 is connected to the metal wiring layer 26, whereas the lead 13B is connected to the metal wiring layer 27.

With the LED lamp A13 of this embodiment, when the LED lamp A13 is turned on, heat is generated at each LED bare chip 11. The heat generated at the LED bare chip 11 is transferred to the metal wiring layer 26 of the flexible wiring substrate 24 through the lead 13A. The heat transferred to the metal wiring layer 26 is transferred to the heat dissipation member 4 through the base film layer 25. The heat transferred to the heat dissipation member 4 is quickly dissipated to the outside.

Thus, similarly to the above-described LED lamp A11, the LED lamp A13 efficiently transfers the heat generated at the LED bare chips 11 to the heat dissipation member 4 and efficiently dissipates the heat transferred to the heat dissipation member 4 to the outside air. Thus, the LED lamp A13 has the same advantages as those of the LED lamp A11. In the LED lamp A13 again, the LED bare chip 11 may be directly mounted on the metal wiring layer 26, similarly to the LED lamp A12.

A method for manufacturing the LED lamp A13 is described below with reference to FIGS. 24-28.

Figure 24:
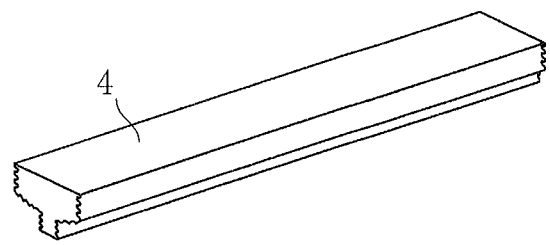
FIG. 24 is a perspective view for describing a method for manufacturing an LED lamp.

First, as shown in FIG. 24, a heat dissipation member 4 is prepared. Specifically, for instance, a plate-shaped or bar-shaped member made of aluminum is cut into a predetermined size, and recesses 42 are formed by using a mold, whereby the heat dissipation member 4 having the shape illustrated in the figure is obtained.

Figure 25:
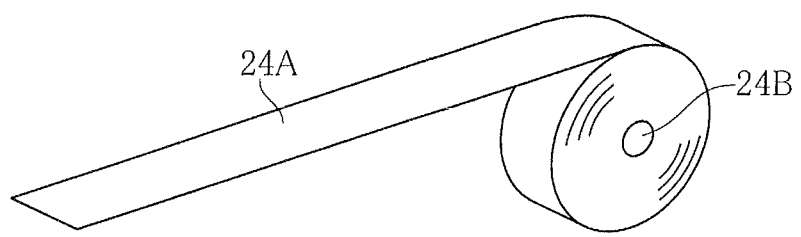
FIG. 25 is a perspective view for describing a method for manufacturing an LED lamp.

Then, as shown in FIG. 25, a base material 24A as an elongated strip, which is to become a flexible wiring substrate 24, is prepared. The base material 24A is in the form of a film in which a plurality of portions to become the flexible wiring substrate 24 are continuously connected to each other. For instance, the base material is wound around a reel 24B. The base material 24A has a laminated structure made up of a base film layer 25, metal wiring layers 26 and 27, a cover coat layer 28 and is formed with a predetermined wiring pattern comprising the metal wiring layers 26 and 27.

Figure 26:
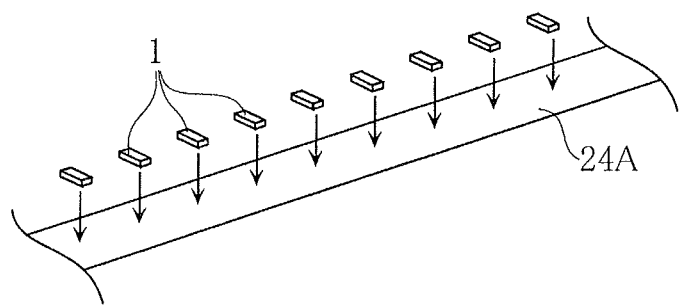
FIG. 26 is a perspective view for describing a method for manufacturing an LED lamp.

Then, as shown in FIG. 26, LED modules 1 are mounted on the base material 24A. Specifically, in each portion to become a flexible wiring substrate 24, LED modules 1 are surface-mounted at a predetermined position on the exposed metal wiring layers and 27. This surface mounting employs reflowing. Specifically, for instance, solder is printed at a predetermined position on the metal wiring layers 26 and 27, the LED module 1 is then placed on the printed portion, and then the solder is melted by heating in a reflow furnace, whereby the LED module 1 is surface-mounted on the base material 24A. The base material 24A after the LED modules 1 are mounted may be wound into a reel.

Figure 27:
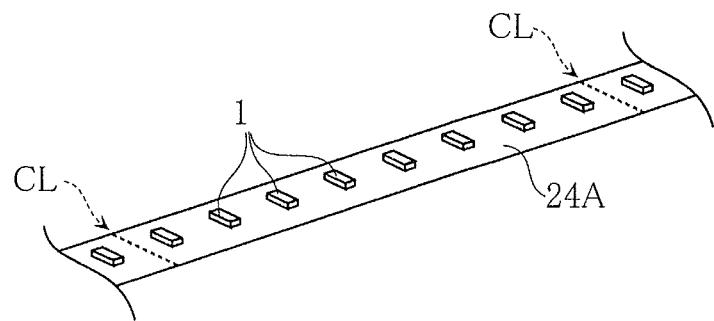
FIG. 27 is a perspective view for describing a method for manufacturing an LED lamp.

Then, as shown in FIG. 27, the base material 24A is cut at cutting positions CL into the length of the heat dissipation member 4. The cutting of the base material 24A may be performed before mounting the LED modules 1 on the base material 24A.

Figure 28:
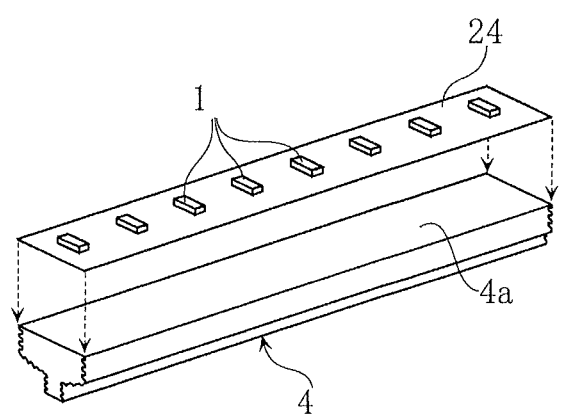
FIG. 28 is a perspective view for describing a method for manufacturing an LED lamp.

Then, as shown in FIG. 28, the flexible wiring substrate 24 obtained by the cutting is bonded to the upper surface 4a of the heat dissipation member 4 with e.g. an adhesive. Then, a base 82 provided with terminals 85 is attached to each end of the heat dissipation member 4 in the longitudinal direction. By these process steps, the LED lamp A13 shown in FIG. 23 is obtained.

In the above-described manufacturing process, the LED modules 1 can be mounted on the flexible wiring substrate 24 after the flexible wiring substrate 24 is bonded to the heat dissipation member 4. However, since the heat dissipation member 4 is made of Al and is not suitable for reflowing which involves heating at a high temperature, the LED modules 1 are mounted on the flexible wiring substrate 24 before the flexible wiring substrate 24 is bonded to the heat dissipation member 4 in this manufacturing process.

According to the above-described manufacturing process, the use of the flexible wiring substrate 24 facilitates the manufacture of the LED lamp. That is, with the structure of the LED lamp A11, the works such as film formation or etching are necessary to form the insulating layer 44 and the metal wiring layers 45A, 45B, and the works to form the protective layer 46 is also necessary. In contrast, in the LED lamp A13 of the thirteenth embodiment, the use of the flexible wiring substrate 24 allows these works to be eliminated, whereby the time and process steps of the manufacturing process are reduced.

The LED lamp according to the present invention is not limited to the foregoing embodiment. The specific structure of each part of the LED lamp according to the present invention can be varied in design in many ways. For instance, the shape of the heat dissipation member 4 is not limited to the above-described ones. The insulating layer 44 does not necessarily need to cover the entire upper surface 4a of the heat dissipation member 4, and part of the upper surface 4a of the heat dissipation member 4 may be exposed.

Figure 29:
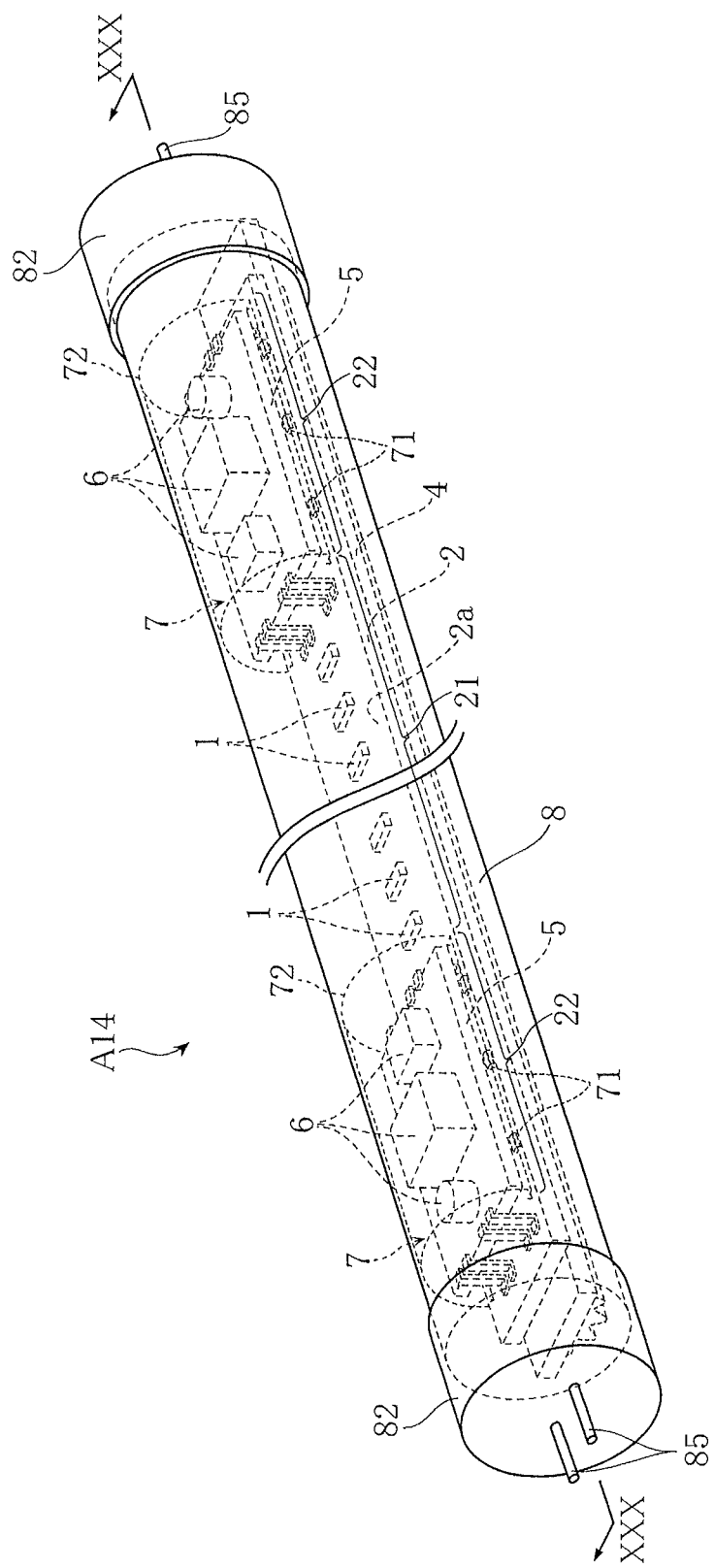
FIG. 29 is a perspective view showing an LED lamp according to a fourteenth embodiment of the present invention.
Figure 30:
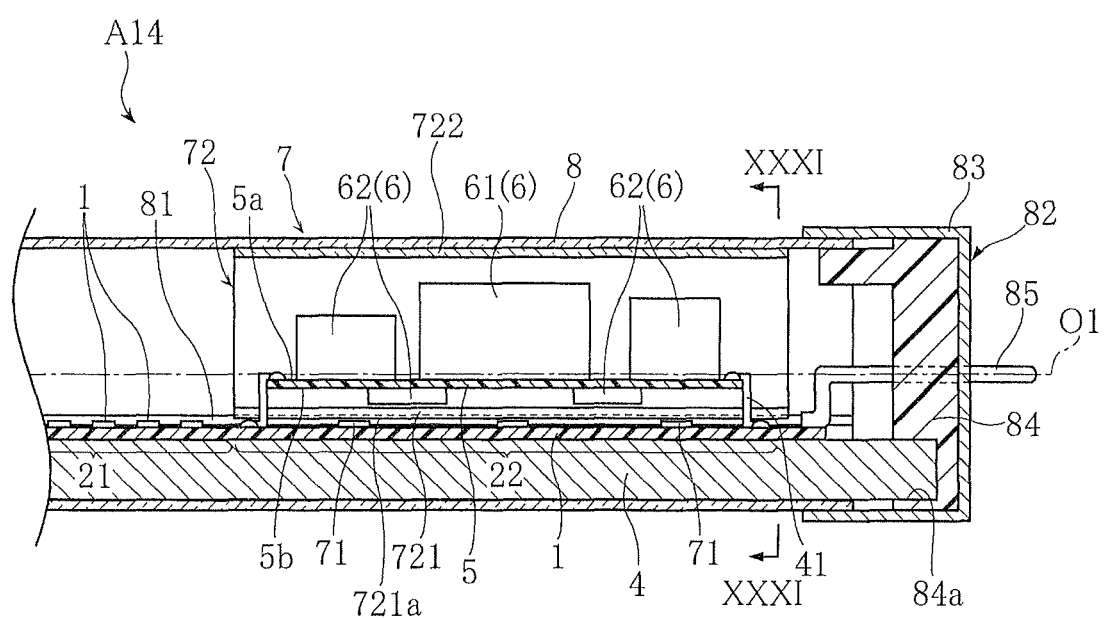
FIG. 30 is an enlarged sectional view taken along lines XXX-XXX in FIG. 29.
Figure 31:
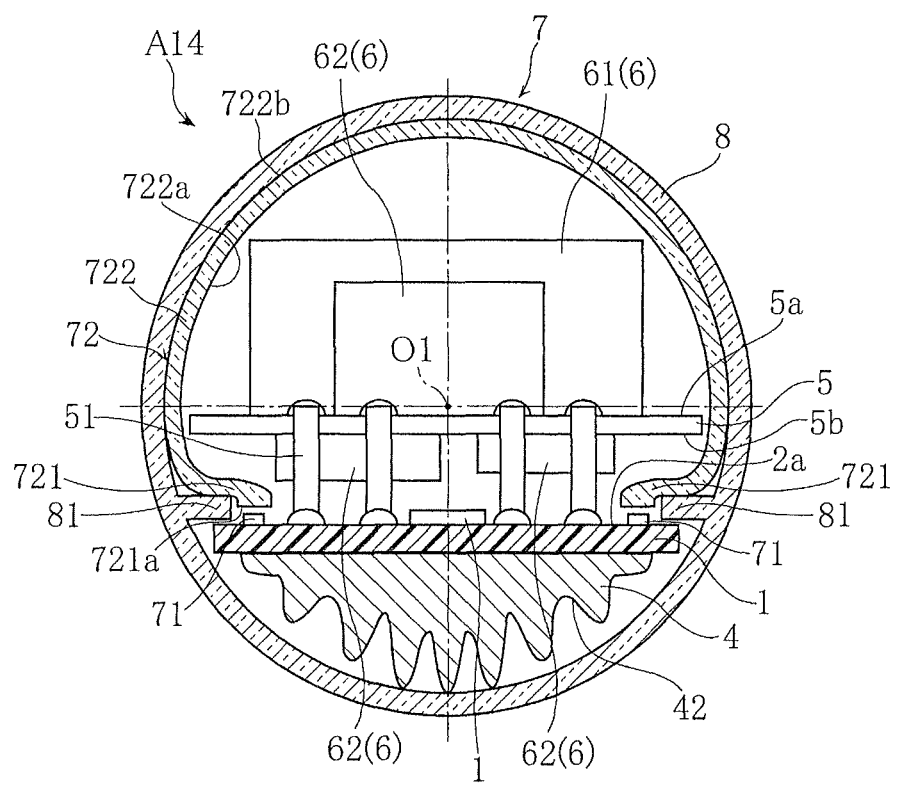
FIG. 31 is an enlarged sectional view taken along lines XXXI-XXXI in FIG. 30.

FIGS. 29-31 show an LED lamp according to a fourteenth embodiment of the present invention. The LED lamp A14 of this embodiment includes a substrate 2, a plurality of LED modules 1, a heat dissipation member 4, power supply substrates 5, a plurality of power supply parts 6, a light-transmitting cover 8, auxiliary light source means 7 and a pair of bases 82. For instance, the LED lamp is used as attached to a general-use fluorescent lighting fixture, as a substitute for a straight-tube fluorescent lamp.

The substrate 2 is made of e.g. glass-fiber-reinforced epoxy resin and has an elongated rectangular shape. A wiring (not shown) is formed at appropriate portions on the surface of the substrate 2. The substrate 2 is laid on the heat dissipation member 4, which will be described later, and attached to the heat dissipation member 4 with e.g. screws.

The LED modules 1 are the light source of the LED lamp A14 and mounted on the upper surface 2a of the substrate 2. The LED modules 1 are arranged side by side at predetermined intervals in the longitudinal direction of the substrate 2 and connected in series by a wiring not shown. As shown in FIGS. 29 and 30, the LED modules 1 are arranged in the light source region 21 which is a region excluding ends of the substrate 2 spaced in the longitudinal direction. As the LED module 1, one including e.g. a white LED and packaged for surface mounting is suitably used.

The heat dissipation member 4 is made of e.g. Al and has a long, thin, block-like shape extending in the longitudinal direction of the substrate 2. As shown in FIG. 31, the surface of the heat dissipation member 4 is formed with a plurality of recesses 42, and hence, irregular. The recesses 42 extend substantially along the entire length of the heat dissipation member 4 in the longitudinal direction of the substrate 2. The recesses 42 can be formed by making the heat dissipation member 4 by using a mold having projections.

Each of the power supply substrates 5 is made of e.g. glass-fiber-reinforced epoxy resin and has an elongated rectangular shape. A wiring (not shown) is formed at appropriate portions on the surface of the power supply substrate 5. The power supply substrate 5 is attached to the substrate 2 by a plurality of leads 51 made of metal. The leads 51 are provided at ends of the power supply substrate 5 spaced in the longitudinal direction, with one end of each lead fixed to the power supply substrate 5 with solder while the other end of the lead soldered to a pad (not shown) provided on the upper surface 2a of the substrate 2. With this arrangement, the power supply substrate 5 is held spaced from the substrate 2 and the heat dissipation member 4. The wiring of the substrate 2 and the wiring of the power supply substrate 5 are electrically connected to each other via the leads 51.

The power supply parts 6 function as a power supply circuit for lighting the LED modules 1 and auxiliary LED modules 71, which will be described later, and are mounted on opposite surfaces (the upper surface 5a and the lower surface 5b) of each power supply substrate 5. The power supply parts 6 include an AC/DC converter 61, and other functional parts 62 such as a capacitor and a resistor, and are structured such that alternating current supplied from a commercial power supply is converted into a constant direct current and supplied to the LED modules 1 and the auxiliary LED modules 71, which will be described later. The AC/DC converter 61 is larger and occupies a larger area than other parts mounted on the power supply substrate 5.

The power supply parts 6 and the power supply substrates 5 on which the power supply parts 6 are mounted are arranged at power supply regions 22 positioned at ends of the substrate 2 spaced in the longitudinal direction.

The light-transmitting cover 8 accommodates the substrate 2, the heat dissipation member 4 and the power supply substrates 5. As shown in FIG. 31, the light-transmitting cover is in the form of a straight tube having a circular cross section. The inner surface of the light-transmitting cover 8 is integrally formed with a pair of projections 81 that project inward. Each of the projections 81 is deviated downward (in the radial direction) from the center axis O1 of the light-transmitting cover 8, projects within a plane parallel to the center axis O1, and extends in the direction along the center axis O1. The light-transmitting cover 8 having this structure is formed as a single-piece member by extrusion of a synthetic resin such as polycarbonate.

The widths of the substrate 2 and the heat dissipation member 4 and the dimension of the heat dissipation member 4 in the vertical direction are determined so that the substrate 2 and the heat dissipation member 4 having the above-described structure are accommodated in a space below the projections 81 in FIG. 31. In the accommodation state shown in FIG. 31, the movement of the substrate 2 relative to the light-transmitting cover 8 in a direction perpendicular to the center axis O1 (upward direction in the figure) is restricted by the contact of the upper surface 2a with the projections 81. The bottom of the heat dissipation member 4 is held in contact with the inner surface of a lower portion of the light-transmitting cover 8.

The substrate 2 is located at a position deviated from the center axis O1 of the light-transmitting cover 8 in a direction opposite to the upper surface 2a, whereas the power supply substrate 5 is located adjacent to the center axis O1 of the light-transmitting cover 8. In this way, the power supply substrate 5 is located closer to the center axis O1 than the substrate 2 is. This allows the width of the power supply substrate 5 to be dimensioned larger than that of the substrate 2. The accommodation of the substrate 2, the heat dissipation member 4 and the power supply substrates 5 in the light-transmitting cover 8 is performed by inserting the substrate 2 and the heat dissipation member 4 into the space below the projections 81 in the light-transmitting cover 8 by sliding movement.

The auxiliary light source means 7 is provided for emitting light to the outside from the area of the light-transmitting cover 8 that corresponds to the power supply region 22, and includes a plurality of auxiliary LED modules 71 and a light guide 72. Herein, "the area of the light-transmitting cover 8 that corresponds to the power supply region 22" refers to the area, of the light-transmitting cover 8, that is located above the substrate 2 and that substantially overlaps the power supply region 22 in the longitudinal direction of the light-transmitting cover 8.

The plurality of auxiliary LED modules 71 are mounted on the upper surface 2a of the substrate 2. Specifically, the auxiliary LED modules 71 are provided at the power supply region 22 of the substrate 2 and arranged at predetermined intervals in the longitudinal direction of the substrate 2 at a position close to edges of the substrate 2 spaced in the width direction. The auxiliary LED modules 71 have lower power consumption than the LED modules 1 and serve as the auxiliary light source of the LED lamp A14. As the auxiliary LED module 71, one including e.g. a white LED and packaged for surface mounting is suitably used, similarly to the LED module 1.

The light guide 72 is provided for efficiently guiding the light from the auxiliary LED modules 71 to the light-transmitting cover 8. The light guide comprises a member with a high transparency made of an acrylic resin such as PMMA (polymethyl methacrylate). The light guide member 72 is generally cylindrical and arranged inside the light-transmitting cover 8 at a position corresponding to the power supply region 22. The light guide member 72 is made by e.g. injection molding using a mold and includes light introducing portions 721 and a light emitting portion 722, as shown in FIGS. 30 and 31. The circumferential surfaces of the light introducing portions 721 and the light emitting portion 722 are a smooth mirror surface.

The light introducing portions 721 are provided for introducing the light from the auxiliary LED modules 71 into the light guide 72. The end surfaces that face the auxiliary LED modules 71 are light incident surfaces 721a. In this embodiment, the light introducing portions 721 are appropriately curved and arranged to be connected to ends of the light emitting portion 722 spaced in the circumferential direction. The circumferential surface of the light introducing portions 721 except the light incident surfaces 721a is coated with e.g. a white paint so that light entering the light introducing portions 721 is prevented from leaking to the outside.

The light emitting portion 722 is in the form of a part of a cylinder that is uniform in the longitudinal direction along the center axis O1 of the light-transmitting cover 8. The light emitting portion includes a light reflection surface 722a formed on the inner side and a light emitting surface 722b formed on the outer side. The light reflection surface 722a reflects the light traveling through the light introducing portion 721 toward the light emitting surface 722b facing the light reflection surface 722a. The light reflection surface is e.g. coated with a white paint, thereby having a function to scatter and reflect light. The light emitting surface 722b emits the light reflected at the light reflection surface 722a toward the light-transmitting cover 8. The light emitting surface is substantially held in close contact with the inner surface of the light-transmitting cover 8. As the light reflection surface 722a, a rough surface with minute irregularities may be employed instead of a surface coated with a white paint. In this case, the rough surface with minute irregularities may be obtained by molding the light guide 72 using a mold that is partially grained or by performing blasting with respect to a predetermined portion after molding.

Each portion of the light guide 72 having the above-described structure is dimensioned such that the light guide can be accommodated in a space above the projections 81 in the light transmitting cover 8 shown in FIG. 31. In the accommodation state shown in FIG. 31, the movement of the light guide 72 relative to the light-transmitting cover 8 in a direction perpendicular to the center axis O1 (downward direction in the figure) or in the circumferential direction of the light-transmitting cover 8 is restricted by the contact of the light introducing portions 721 with the projections 81. The accommodation of the light guide 72 in the light-transmitting cover 8 is performed by inserting the light guide 72 into the space above the projections 81 in the light-transmitting cover 8 by sliding movement.

The paired bases 82 are the portions to be fitted to the sockets of a fluorescent lighting fixture for electric power supply from a commercial AC power supply. As shown in FIG. 30, each base 82 includes a cover 83 in the form of a bottomed cylinder, a resin block 84 held in a hollow portion of the cover 83, and two terminals 85. The resin block 84 is formed with a recess 84a. An end of the heat dissipation member 4 in the longitudinal direction is fitted in the recess 84a, whereby the base 82 is attached to the heat dissipation member 4. Thus, in the LED lamp A14, the heat dissipation member 4 is supported by the paired bases 82.

Between the cover 83 and the resin block 84 is defined a gap in the form of part of a cylinder. In the state in which the base 82 is attached to the heat dissipation member 4, one of the ends of the light-transmitting cover 8 spaced in the longitudinal direction is received in this gap. The terminal 85 penetrates the cover 83 and the resin block 84. An end (outer end) of the terminal 85 is to be inserted into an inlet port of the socket of a fluorescent lighting fixture, whereas the other end of the terminal 85 is electrically connected to the wiring of the substrate 2.

The advantages of the LED lamp A14 having the above-described structure are described below.

To use of the LED lamp A14, electric power is supplied, with the terminals 85 of the bases 82 fitted into the inlet ports of the sockets of a fluorescent lighting fixture, whereby the LED modules 1 and the auxiliary LED modules 71 are turned on.

As noted before, the LED lamp A14 of the present embodiment includes auxiliary light source means 7 for emitting light to the outside from the area of the light-transmitting cover 8 that corresponds to each power supply region 22. Thus, during the use of the LED lamp A14, light is emitted not only from the area corresponding to the light source region 21 of the light-transmitting cover 8 but also from the are corresponding to the power supply region 22 of the light-transmitting cover 8. Thus, the LED lamp A14 prevents degradation of illumination quality due to the presence of the power supply region 22.

In the preset embodiment, the auxiliary light source means 7 includes a plurality of auxiliary LED modules 71 and the light guide 72, and the auxiliary LED modules 71 are arranged in the power supply region 22 of the substrate 2. This arrangement ensures that light efficiently reaches also the area of the light-transmitting cover 8 that corresponds to the power supply region 22. Further, with the provision of the light guide 72, light from the auxiliary LED modules 71 is uniformly emitted to the outside from the area of the light-transmitting cover 8 that corresponds to each power supply region 22 through the light guide 72. This is suitable for preventing degradation of illumination quality of the LED lamp A14.

The light emitting portion 722 of the light guide 72 has the light reflection surface 722a that reflects the light from the auxiliary LED modules 71 introduced through the light introducing portions 721 toward the light emitting surface 722b. Thus, the light traveling within the light guide 72 is reflected by the light reflection surface 722a to efficiently travel to the light emitting surface 722b. Since the light reflection surface 722a has a function to scatter and reflect light, a uniform amount of light is emitted from each portion of the light emitting surface 722b. This is suitable for preventing degradation of illumination quality of the LED lamp A14.

In this embodiment, the power supply parts 6 are mounted on opposite surfaces (the upper surface 5a and the lower surface 5b) of the power supply substrate 5. Thus, as compared with the structure in which the power supply parts 6 are mounted only on e.g. the upper surface 5a of the power supply substrate 5, the power supply parts 6 are mounted with a higher efficiency, so that the area of the power supply substrate 5 can be made smaller. Accordingly, the dimension of the power supply substrate 5 in the longitudinal direction along the center axis O1 of the light-transmitting cover 8 can be made smaller. This allows reduction of the area of the power supply region 22 in the substrate 2 and hence allows a large area to be secured as the light source region 21. Thus, with the LED lamp A14, the illumination quality is enhanced.

The power supply substrate 5 is positioned closer to the center axis O1 of the light-transmitting cover 8 than the substrate 2 is. This allows the dimension of the power supply substrate 5 in the width direction perpendicular to the center axis O1 of the light-transmitting cover 8 to be made larger than that of the substrate 2. Thus, a power supply substrate 5 having a predetermined area can be achieved with a reduced dimension in the longitudinal direction along the center axis O1 of the light-transmitting cover 8. Thus, the power supply region 22 can be further made smaller, which is suitable for enhancing the illumination quality of the LED lamp A14.

In this embodiment, the substrate 2 is laid on the heat dissipation member 4. Thus, heat generated during the lighting of the LED modules 1 and the auxiliary LED modules 71 is effectively dissipated to the outside through the heat dissipation member 4, whereby deterioration of the LED modules 1 and the auxiliary LED modules 71 is prevented. Moreover, since the heat dissipation member 4 extends substantially along the entire length of the light-transmitting cover 8, the heat dissipation member functions as a structural material of the LED lamp A14. Thus, the provision of the heat dissipation member 4 secures the rigidity of the LED lamp A14.

A pair of projections 81 are formed on the inner side of the light-transmitting cover 8. The movement of the substrate 2 in a direction perpendicular to the center axis O1 of the light-transmitting cover 8 (radial direction of the light-transmitting cover 8) is restricted by the contact of the projections 81 with the upper surface 2a at the ends of the substrate 2 spaced in the width direction. Further, the movement of the light guide 72 in a direction perpendicular to the center axis O1 of the light-transmitting cover 8 (radial direction of the light-transmitting cover 8) or in the circumferential direction of the light-transmitting cover 8 is restricted by the contact of the projections 81 with the light introducing portions 721 of the light guide 72. Thus, in assembling the LED lamp A14, positioning of the substrate 2 and the light guide 72 relative to the light-transmitting cover 8 is achieved just by inserting the substrate 2 and the light guide 72 into the light-transmitting cover 8. Thus, assembling of the LED lamp A14 is easy.

Figure 32:
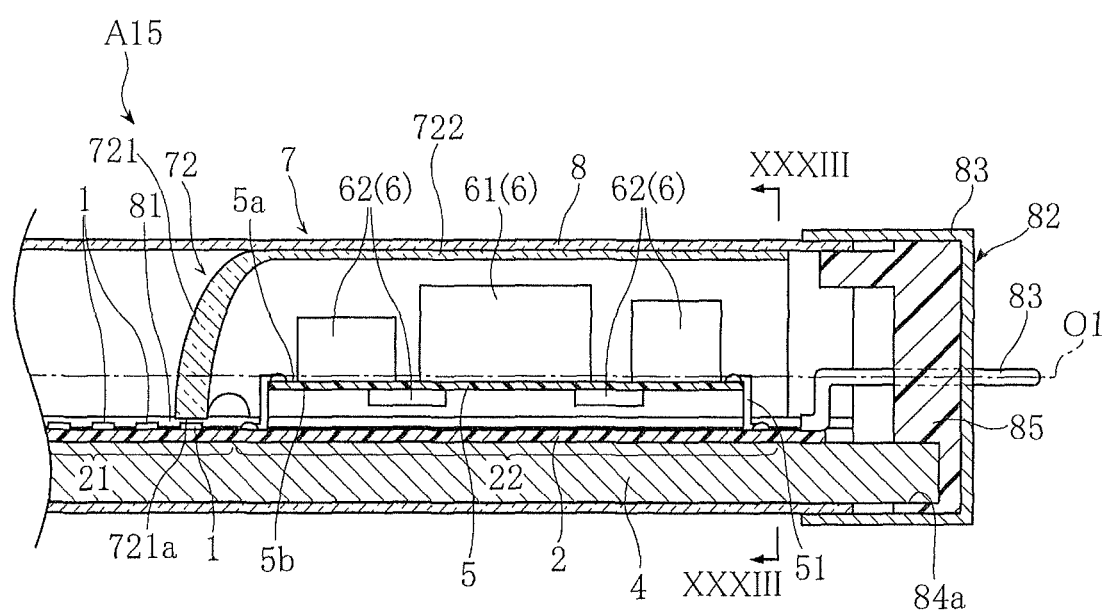
FIG. 32 is a sectional view showing an LED lamp according to a fifteenth embodiment of the present invention.
Figure 33:
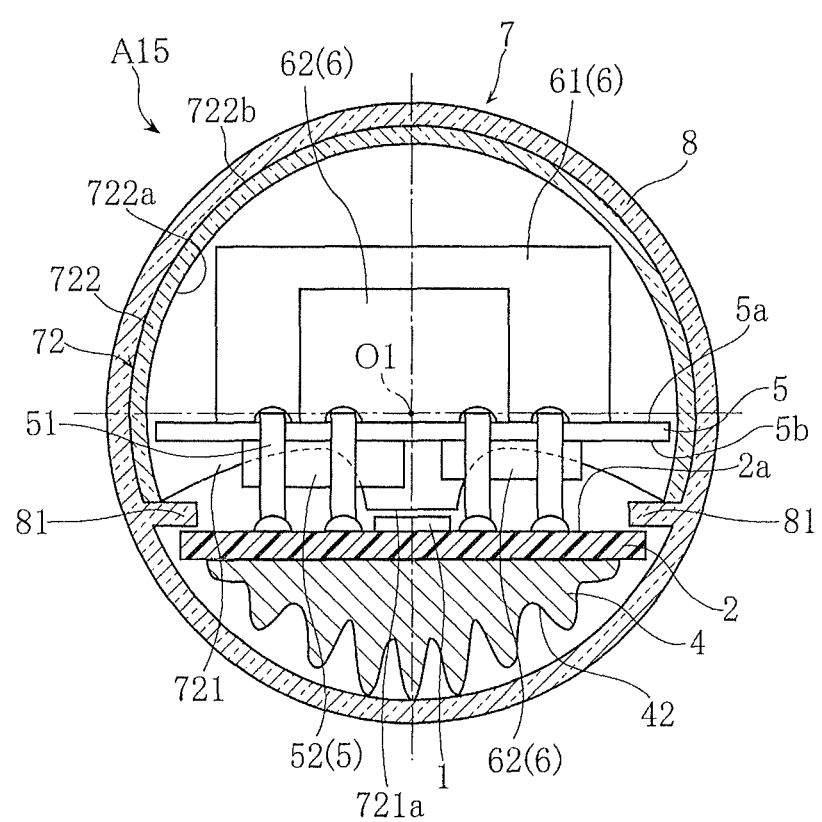
FIG. 33 is an enlarged sectional view taken along lines XXXIII-XXXIII in FIG. 32.

FIGS. 32 and 33 illustrate an LED lamp according to a fifteenth embodiment of the present invention. The LED lamp A15 of this embodiment is different from the LED lamp A14 of the foregoing embodiment in structure of the auxiliary light source means 7. The LED lamp A15 does not include auxiliary LED modules 71, and is structured to guide the light from the LED modules 1 to an area corresponding to the power supply region 22 of the light-transmitting cover 8 through the light guide 72. The light guide 72 of this embodiment is made different from that of the foregoing embodiment in many points.

The light introducing portion 721 of the light guide 72 is provided for introducing the light from the LED module 1 located at one of the ends of the substrate 2 spaced in the longitudinal direction into the light guide 72. The end surface that faces the LED module 71 is a light incident surface 721a. The light introducing portion 721 is appropriately curved and arranged to be connected to one of the ends of the light emitting portion 722 spaced in the longitudinal direction. As shown in FIG. 33, the movement of the light guide 72 relative to the light-transmitting cover 8 in a direction perpendicular to the center axis O1 (downward direction in the figure) or in the circumferential direction of the light-transmitting cover 8 is restricted by the contact of the end surfaces of the light emitting portion 722 spaced in the circumferential direction with the projections 81.

According to the LED lamp A15 of this embodiment, light from the existing LED modules 1 is uniformly emitted to the outside from the area of the light-transmitting cover 8 that corresponds to each power supply region 22 through the light guide 72. This is suitable for preventing degradation of illumination quality of the LED lamp A15. Since the LED lamp A15 does not require additional LEDs, the power supply circuit constituted of a plurality of power supply parts 6 can be simplified.

Figure 34:
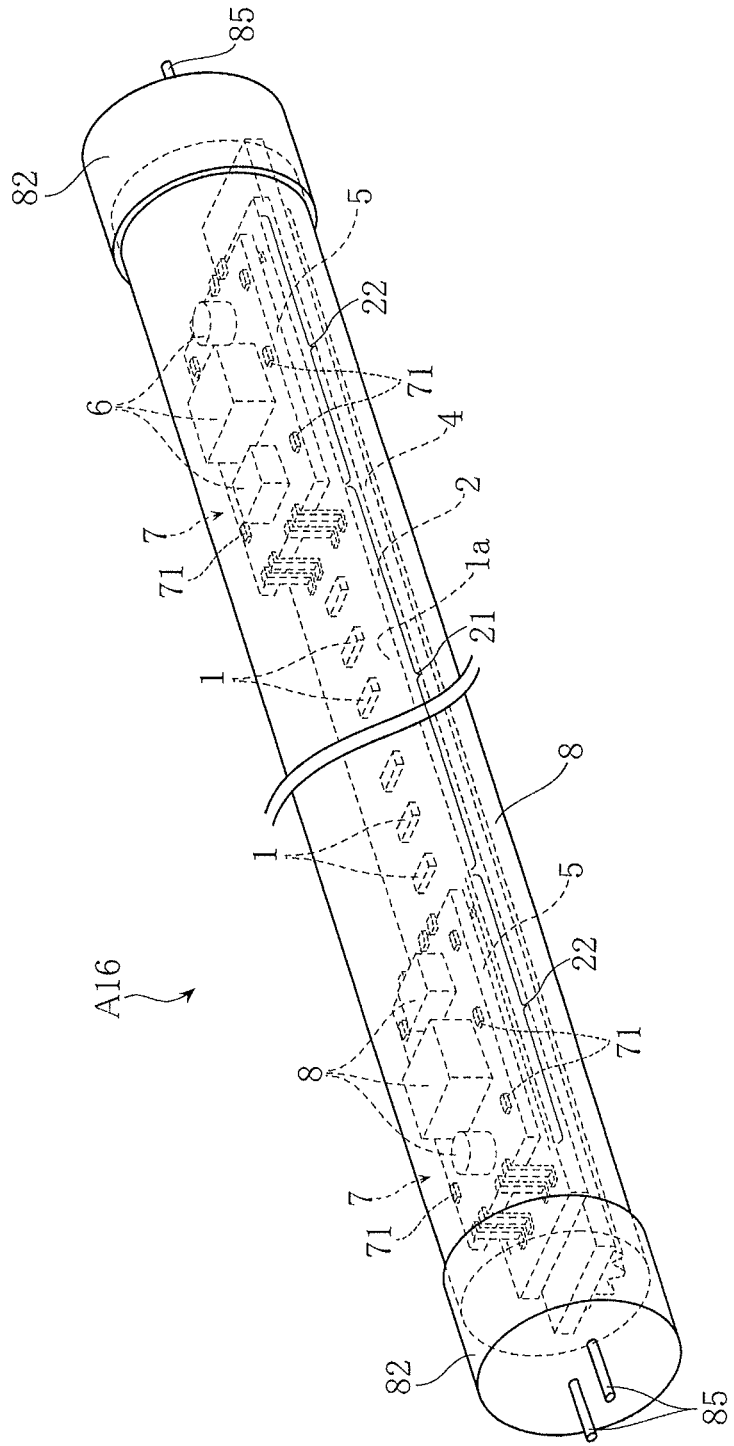
FIG. 34 is a perspective view showing an LED lamp according to a sixteenth embodiment of the present invention.
Figure 35:
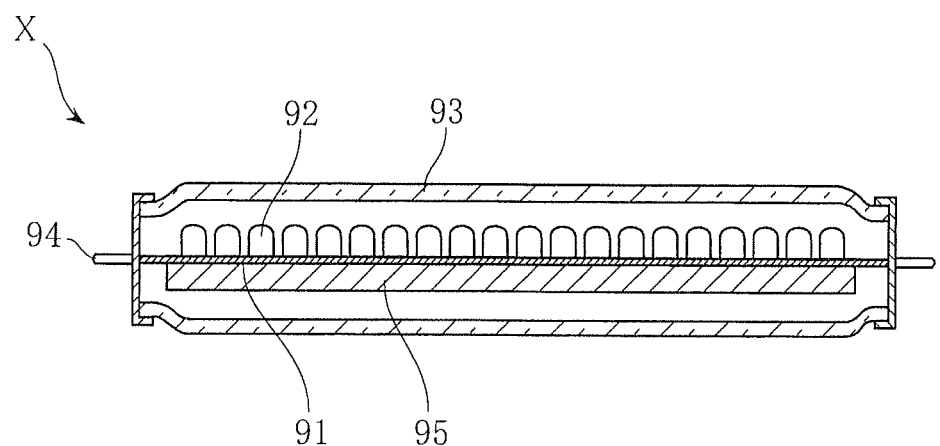
FIG. 35 is a sectional view showing an example of conventional LED lamp.
Figure 36:
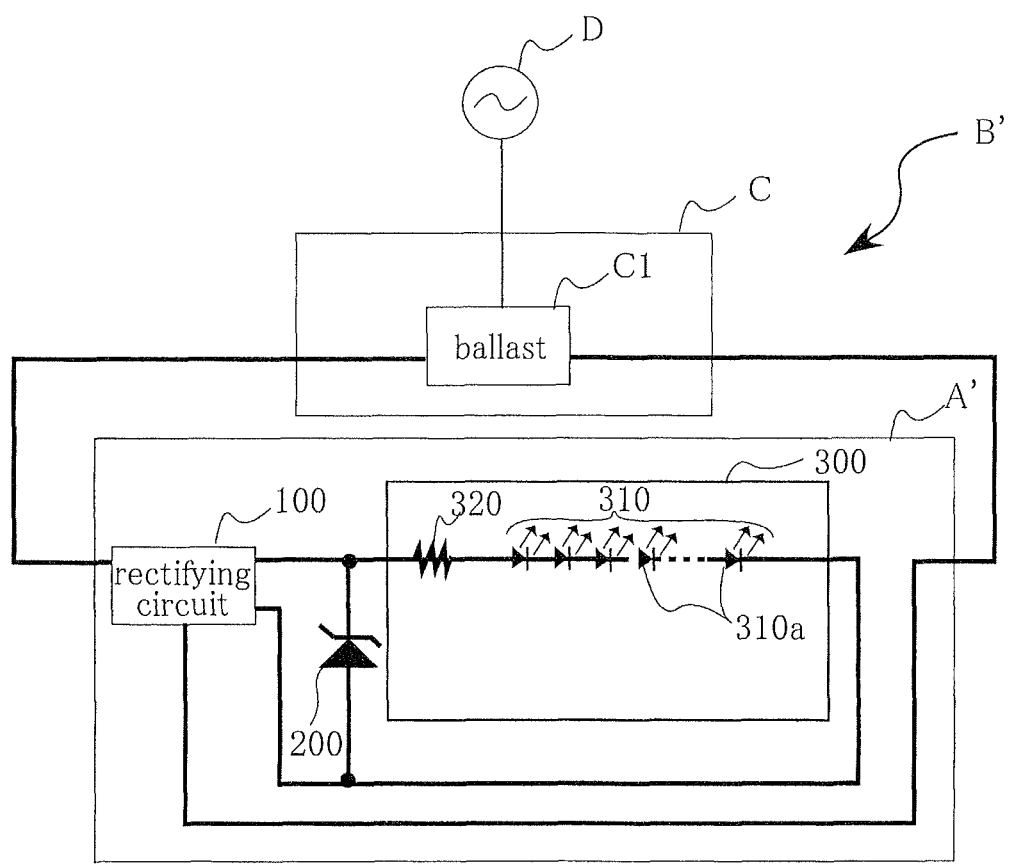
FIG. 36 is a block diagram of an LED lighting apparatus obtained by attaching an LED lamp to a conventional general-use fluorescent lighting fixture.

FIG. 34 illustrates an LED lamp according to a sixteenth embodiment of the present invention. The LED lamp A16 of this embodiment is different from the LED lamp A14 of the foregoing embodiment in structure of the auxiliary light source means 7. Specifically, the LED lamp A16 is different from the foregoing embodiment in arrangement of the auxiliary LED modules 71, and further, does not include a light guide 72. In this embodiment, the auxiliary LED modules 71 are mounted on the upper surface of the power supply substrate 5 and arranged at predetermined intervals in the longitudinal direction of the power supply substrate 5 at edges of the power supply substrate 5 spaced in the width direction.

In the LED lamp A16 of this embodiment, light from the auxiliary LED modules 71 mounted on the power supply substrate can be emitted to the outside from an area of the light-transmitting cover 8 that corresponds to the power supply region 22. Further, as compared with the substrate 2, the power supply substrate 5 is deviated in the direction (upward in the figure) in which light from the auxiliary modules is mainly emitted to the outside of the light-transmitting cover 8. Thus, the light emitted from the auxiliary LED modules 71 efficiently reaches also the area of the light-transmitting cover 8 that corresponds to the power supply region 22.

The invention claimed is:

1. An LED lamp comprising:
a plurality of LED light sources;
a substrate on which the LED light sources are mounted in a row, the substrate including first and second ends spaced from each other in a longitudinal direction of the substrate;
a light guide provided on the substrate for covering the LED light sources;
a light-transmitting cover that covers an entirety of an outer surface of the light guide; and
bases attached to the first and second ends of the substrate, respectively;
wherein the light guide covers each of the LED light sources,
wherein the light guide is semicircular in cross section, and
wherein each of the bases includes a pair of terminals each configured to be fitted into an inlet port of a fluorescent lighting fixture.

2. The LED lamp according to claim 1, further comprising a plurality of heat dissipation members attached to a surface of the substrate that is opposite to a mount surface on which the LED light sources are mounted, wherein the plurality of heat dissipation members are spaced apart from each other in a width direction of the substrate.

3. The LED lamp according to claim 2, wherein some of the plurality of heat dissipation members are smaller in length than the rest of the plurality of heat dissipation members.

4. The LED lamp according to claim 3, wherein the plurality of heat dissipation members are greater in length with nearness to a center of the substrate in the width direction.

5. The LED lamp according to claim 1, wherein the light guide contains a fluorescent material that emits light of a wavelength different from a wavelength of light from the LED light sources when excited by the light from the LED light sources.

6. The LED lamp according to claim 1, wherein the LED light source comprises an LED module, the LED module including an LED bare chip and a resin package sealing the LED bare chip.

7. The LED lamp according to claim 2, wherein the LED light source comprises an LED bare chip mounted on the substrate.

8. The LED lamp according to claim 1, wherein the plurality of LED light sources comprise a plurality of first series connection portions connected in parallel with each other, and each of the first series connection portions includes a predetermined number of LED modules connected in series.

9. The LED lamp according to claim 8, wherein the plurality of LED light sources comprise a second series connection portion connected in parallel with each of the first series connection portions, the second series connection portion includes a plurality of LED modules connected in series, and the LED modules of the second series connection portion are greater in number than the LED modules of each of the first series connection portions.

10. The LED lamp according to claim 9, wherein each of the LED modules of each of the first series connection portions is greater in brightness than each of the LED modules of the second series connection portion.

11. The LED lamp according to claim 8, further comprising 4 diodes connected to each of the first series connection portions, wherein the 4 diodes are configured to provide a bridge rectifier circuit.

* * * * *